United States Patent [19]
Glad et al.

[11] Patent Number: 6,089,922
[45] Date of Patent: *Jul. 18, 2000

[54] ADAPTABLE COMMUNICATIONS CONNECTORS

[75] Inventors: Paul H. Glad; Steve R. McDaniels; David Nagle; Jon R. Hinton, all of Salt Lake City, Utah

[73] Assignee: Xircom, Thousand Oaks, Calif.

[*] Notice: This patent is subject to a terminal disclaimer.

[21] Appl. No.: 09/021,341

[22] Filed: Feb. 10, 1998

Related U.S. Application Data

[63] Continuation of application No. 08/799,799, Feb. 13, 1997, Pat. No. 5,773,332, which is a continuation of application No. 08/402,084, Mar. 10, 1995, abandoned, which is a continuation-in-part of application No. 08/151,249, Nov. 12, 1993, Pat. No. 5,411,405.

[51] Int. Cl.[7] .................................................. H01R 23/02
[52] U.S. Cl. ............................................ 439/676; 439/131
[58] Field of Search .................................... 439/131, 676, 439/946

[56] References Cited

U.S. PATENT DOCUMENTS 1,989,823  2/1935  Raabe .
3,433,886  3/1969  Myers .

(List continued on next page.)

FOREIGN PATENT DOCUMENTS 2101354  1/1994  Canada .
2103514  2/1994  Canada .

(List continued on next page.)

OTHER PUBLICATIONS

The PC Zone, vol. 17CD product catalog, p. 61—"Descartes Card Reader/Writer".
"PCMCIA Redefines Mobile Computing" by Earle J. Robinson—*P/C Computing*, Jul. 1993, pp. 238–248 & 252.
"Worldport Fax/Data PCMCIA 2.0 Modem" USRobotics.
"623K Telephone Jacks" by Molex p. 61.
"616L Type Telephone Jacks" by Molex p. 81.
"Unique Features for SRAM Card" one page.
"Phone Jacks" by Mouser Electronics.
"Modular Jacks" by Pan Pacific Enterprise Co., Inc.
"Fujitsu IC Memory Card Connector, User's Manual", by Fujitsu.
"Computer Reseller/VAR Catalog" by Belkin Components.
"Flash Memory Card" by Centennial.
"The Wizard electronic organizer" by SHARP.
"IC Memory Card" by Panasonic.
"INT4999 Cellular Data Interface" NEC spec.

(List continued on next page.)

*Primary Examiner*—Neil Abrams
*Attorney, Agent, or Firm*—Clayton, Howarth & Cannon, P.C.

[57] ABSTRACT

An apparatus for conveying signals between a communications card and a signal utilization device or network. In one form (FIGS. 1,2), structures are provided for receiving an RJ series plug and for making electrical connection with at the contacts on the plug and conveying any signals on the contacts to a communications device such as a telephone, facsimile machine, modem, or a local area network adapter. A body (102) includes one or more recesses (106) which receive the plug. An expandable and stretchable membrane (114) isolates the contacts in the plug from electrical contact with an object in a surrounding environment such that passage of current from one or more of the electrical contacts to an object present in the surrounding environment is prevented. Also provided (FIGS. 7, 14) is a replaceable direct access arrangement (151, 258) which is replaceably held within the communications device (150, 250). Both the structures providing the receptacles and the direct access arrangement are easily removable in case of damage or if other functions are desired. The replaceable direct access arrangement allows operation in countries having different telecommunications standards and allows operation with many different communications devices. Wireless communication is also provided.

10 Claims, 18 Drawing Sheets

U.S. PATENT DOCUMENTS

| | | |
|---|---|---|
| 3,553,635 | 1/1971 | Lundergan et al. . |
| 3,613,043 | 10/1971 | Scheller et al. . |
| 3,622,684 | 11/1971 | Press et al. . |
| 3,685,002 | 8/1972 | Kennedy . |
| 3,777,303 | 12/1973 | McDonugh . |
| 3,794,956 | 2/1974 | Dubreuil . |
| 4,047,781 | 9/1977 | DeNigris et al. . |
| 4,059,321 | 11/1977 | Rasmussen et al. . |
| 4,103,985 | 8/1978 | Krolak et al. . |
| 4,109,295 | 8/1978 | Rostek et al. . |
| 4,242,721 | 12/1980 | Krolak et al. . |
| 4,303,296 | 12/1981 | Spaulding . |
| 4,482,938 | 11/1984 | Nordan . |
| 4,497,526 | 2/1985 | Myers . |
| 4,511,198 | 4/1985 | Mitchell et al. . |
| 4,603,229 | 7/1986 | Menchetti . |
| 4,648,682 | 3/1987 | Tubbs . |
| 4,758,168 | 7/1988 | Awakowiez et al. . |
| 4,809,360 | 2/1989 | Kraft . |
| 4,878,848 | 11/1989 | Ingalsbe . |
| 4,954,928 | 9/1990 | Jullien . |
| 4,968,260 | 11/1990 | Ingalsbe . |
| 4,969,830 | 11/1990 | Daly et al. . |
| 4,984,982 | 1/1991 | Brownlie et al. . |
| 4,986,762 | 1/1991 | Keith . |
| 4,993,962 | 2/1991 | Noda et al. . |
| 4,997,381 | 3/1991 | Oh . |
| 5,035,641 | 7/1991 | Van-Santbrink et al. . |
| 5,035,649 | 7/1991 | Collier et al. . |
| 5,038,250 | 8/1991 | Uenaka et al. . |
| 5,043,721 | 8/1991 | May . |
| 5,082,450 | 1/1992 | Warren, Sr. et al. . |
| 5,085,591 | 2/1992 | Warren, Sr. et al. . |
| 5,114,356 | 5/1992 | Taybl et al. . |
| 5,122,069 | 6/1992 | Brownlie et al. . |
| 5,132,877 | 7/1992 | Branan et al. . |
| 5,159,533 | 10/1992 | Kuang . |
| 5,182,698 | 1/1993 | Kobyashi et al. . |
| 5,183,404 | 2/1993 | Aldous et al. . |
| 5,196,994 | 3/1993 | Tanuma et al. . |
| 5,242,310 | 9/1993 | Leung . |
| 5,244,397 | 9/1993 | Anhalt . |
| 5,260,994 | 11/1993 | Suffi . |
| 5,285,014 | 2/1994 | Gilchrist . |
| 5,319,083 | 6/1994 | Roebuck et al. . |
| 5,319,516 | 6/1994 | Perkins . |
| 5,336,090 | 8/1994 | Aldous et al. . |
| 5,336,099 | 8/1994 | Aldous et al. . |
| 5,338,210 | 8/1994 | Beckham et al. . |
| 5,385,479 | 1/1995 | Okada ........................... 439/142 |
| 5,386,340 | 1/1995 | Kurz . |
| 5,391,094 | 2/1995 | Kakinoki et al. . |
| 5,395,268 | 3/1995 | Okada ........................... 439/676 |
| 5,411,405 | 5/1995 | McDaniels et al. . |
| 5,457,601 | 10/1995 | Georgopulos et al. . |
| 5,470,237 | 11/1995 | Byezek et al. . |
| 5,477,418 | 12/1995 | MacGregor et al. . |
| 5,499,923 | 3/1996 | Archibald et al. . |
| 5,505,628 | 4/1996 | Ramey et al. . |
| 5,505,633 | 4/1996 | Broadbent . |
| 5,509,811 | 4/1996 | Homic . |
| 5,532,898 | 7/1996 | Price . |
| 5,538,442 | 7/1996 | Okada ........................... 439/676 |
| 5,547,401 | 8/1996 | Aldous et al. . |
| 5,548,483 | 8/1996 | Feldman . |
| 5,561,727 | 10/1996 | Akita et al. . |
| 5,562,463 | 10/1996 | Tan . |
| 5,562,504 | 10/1996 | Moshayedi . |
| 5,608,606 | 3/1997 | Blaney . |
| 5,608,607 | 3/1997 | Dittmer . |
| 5,611,055 | 3/1997 | Krishan et al. . |
| 5,619,396 | 4/1997 | Gee et al. . |
| 5,628,055 | 5/1997 | Stein . |
| 5,634,802 | 6/1997 | Kerklaan . |
| 5,637,018 | 6/1997 | Gargiulo . |
| 5,702,271 | 12/1997 | Steinman . |

FOREIGN PATENT DOCUMENTS

| | | |
|---|---|---|
| 2070571 | 10/1994 | Canada . |
| 355 413 | 7/1989 | European Pat. Off. . |
| 1 195 385 | 6/1965 | Germany . |
| 29607724U1 | 8/1996 | Germany . |
| 62-29344 | 2/1987 | Japan . |
| 62-78656 | 4/1987 | Japan . |
| 64-10585 | 7/1987 | Japan . |
| 64-10585 | 1/1989 | Japan . |
| 1-96055 | 6/1989 | Japan . |
| 1-97652 | 6/1989 | Japan . |
| 1-243384 | 9/1989 | Japan . |
| 2-90481 | 3/1990 | Japan . |
| 2-162667 | 6/1990 | Japan . |
| 3-36477 | 4/1991 | Japan . |
| 3-262069 | 11/1991 | Japan . |
| 3-292519 | 12/1991 | Japan . |
| 4-10748 | 1/1992 | Japan . |
| 4-51761 | 2/1992 | Japan . |
| H6-52923 | 7/1992 | Japan . |
| H6-61658 | 8/1992 | Japan . |
| H6-61659 | 8/1992 | Japan . |
| 6-52923 | 2/1994 | Japan . |
| 6-61658 | 3/1994 | Japan . |
| 6-61659 | 3/1994 | Japan . |
| 8-162233 | 6/1996 | Japan . |
| WO 95/13633 | 5/1995 | WIPO . |

OTHER PUBLICATIONS

"First V.34 PCMCIA modems begin shipping; more expected shortly" by Wendy Pickering—*PC Week,* Jan. 9, 1995, pp. 45 & 48.

"Wireless Physical Layer Standards" by Jan Boer, et al. –*The Global Magazine of Commercial Wireless Technology,* Oct. 1994, vol. 2, No. 10, pp. 15–17.

"Emerging Commerical Applications for Spread Spectrum Radio" by Jim K. Omura—*The Global Magazine of Commercial Wireless Technology,* Oct. 1994, vol. 2, No. 10, pp. 25, 26 & 28.

Egghead Software Product Catalog, p. 16—"Maxtor Desk-Runner desktop adapter";"Maxtor Mobile Max hard drive"; "MobileMax PCMCIA flash memory card".

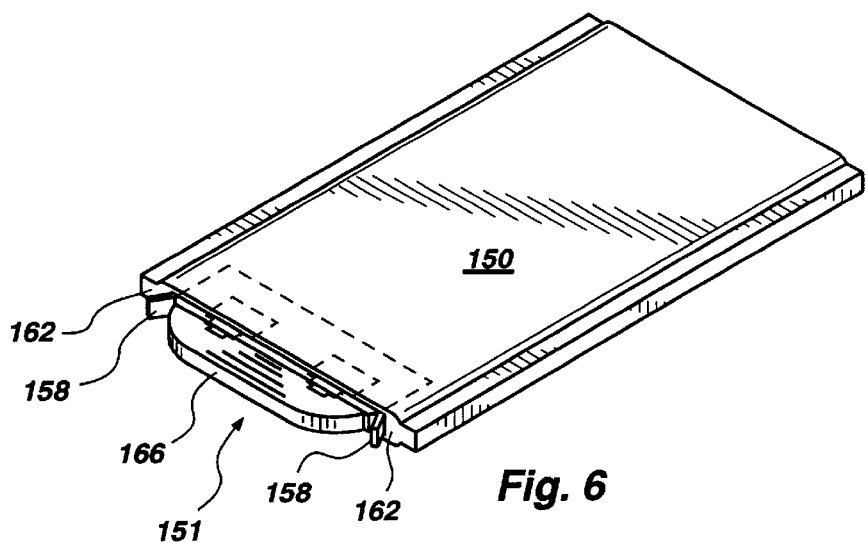
Fig. 6
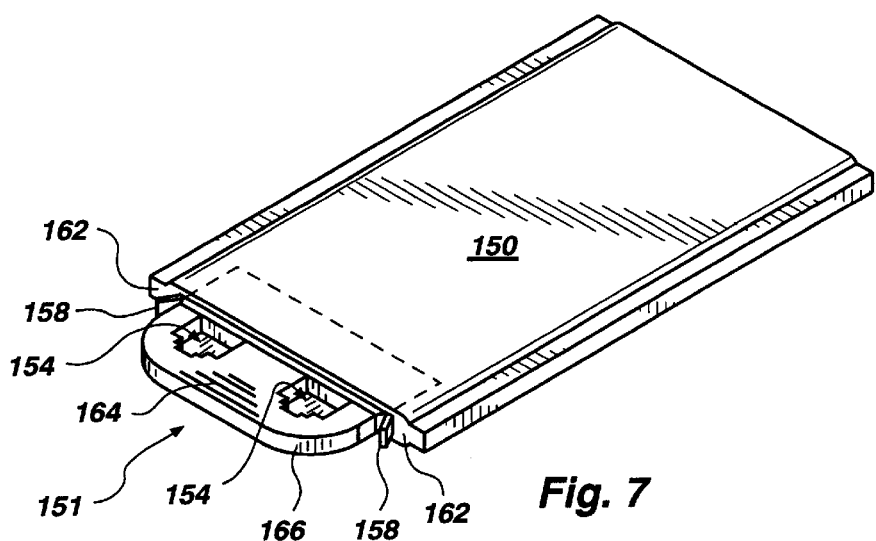
Fig. 7
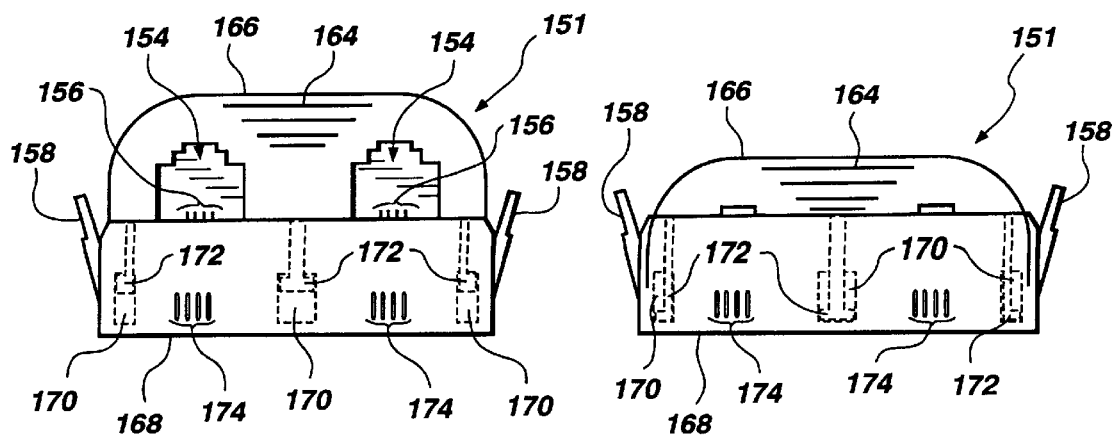
Fig. 8
Fig. 9

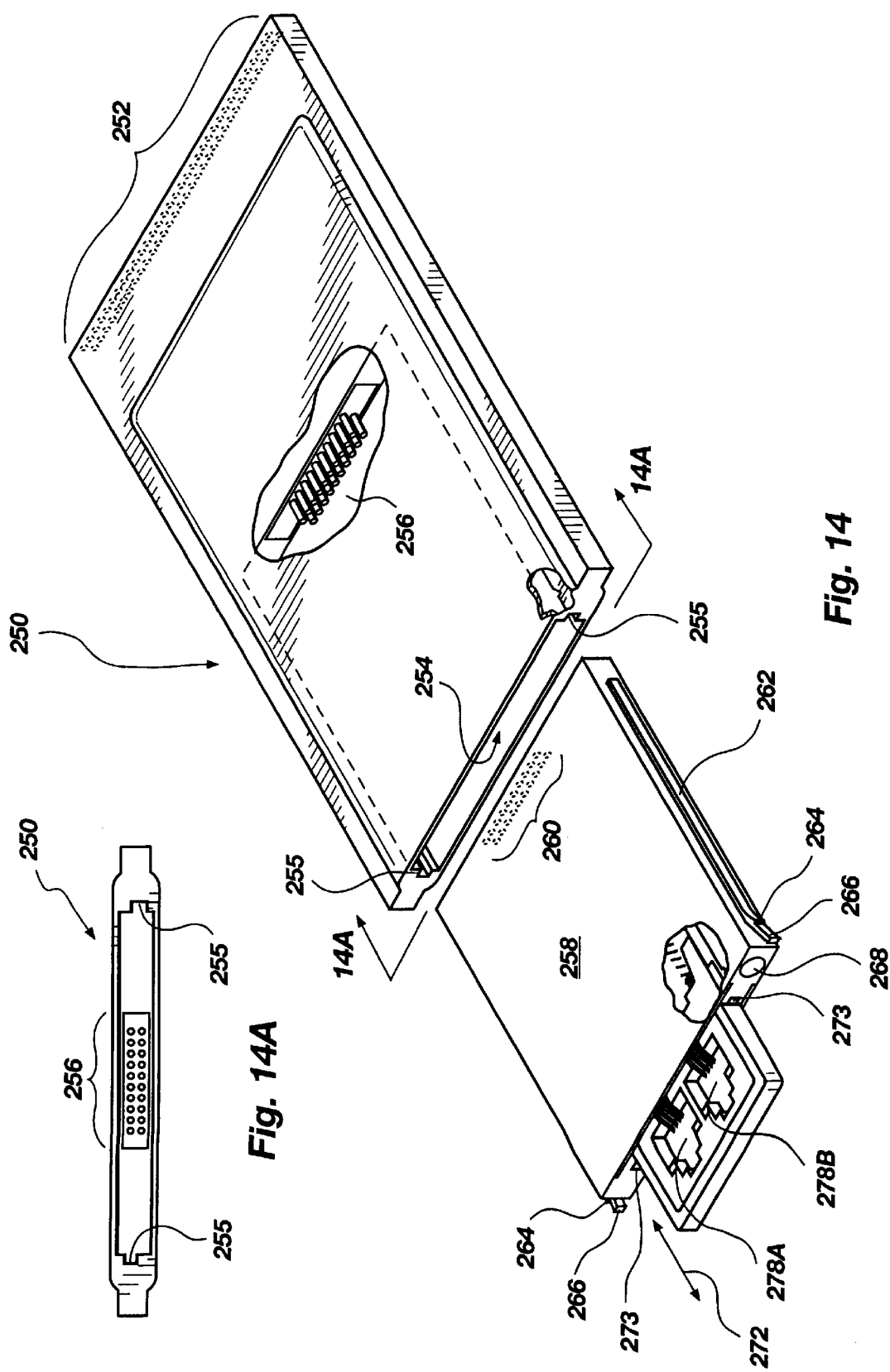

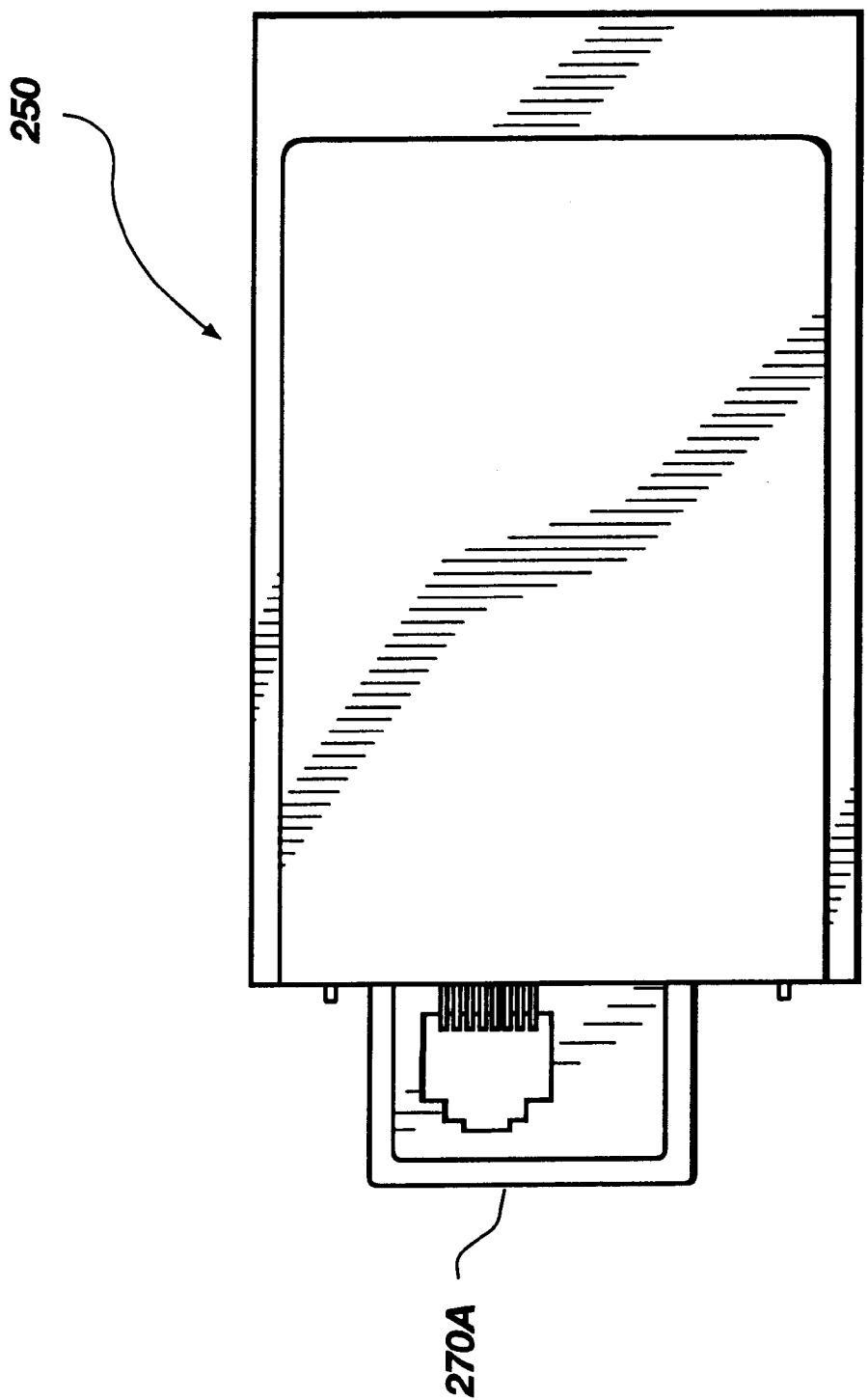

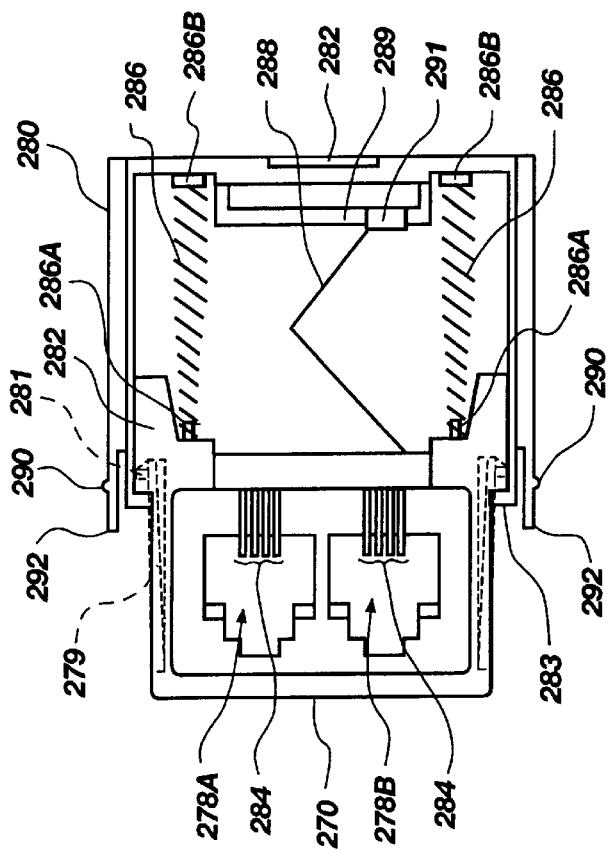
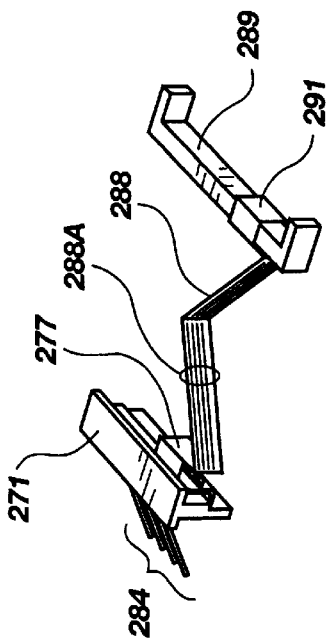
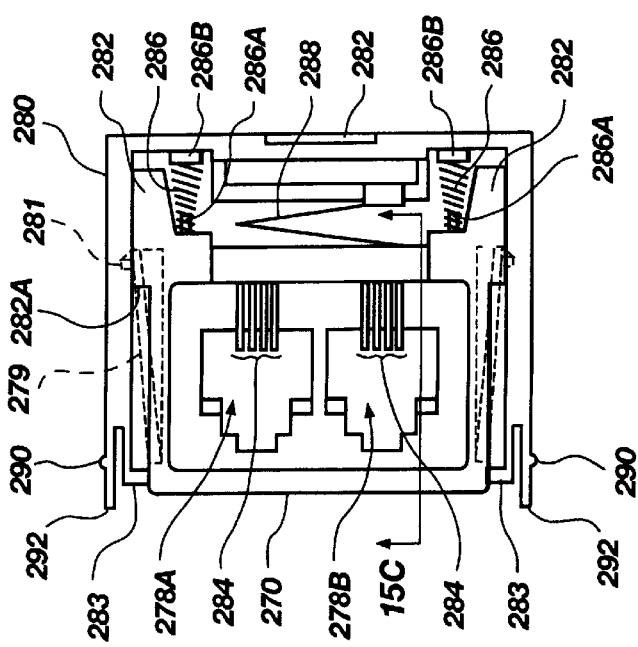
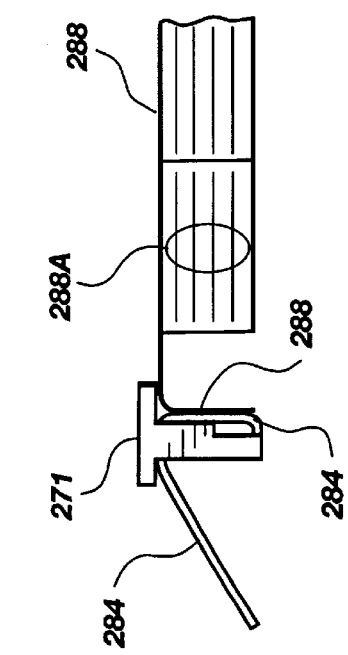

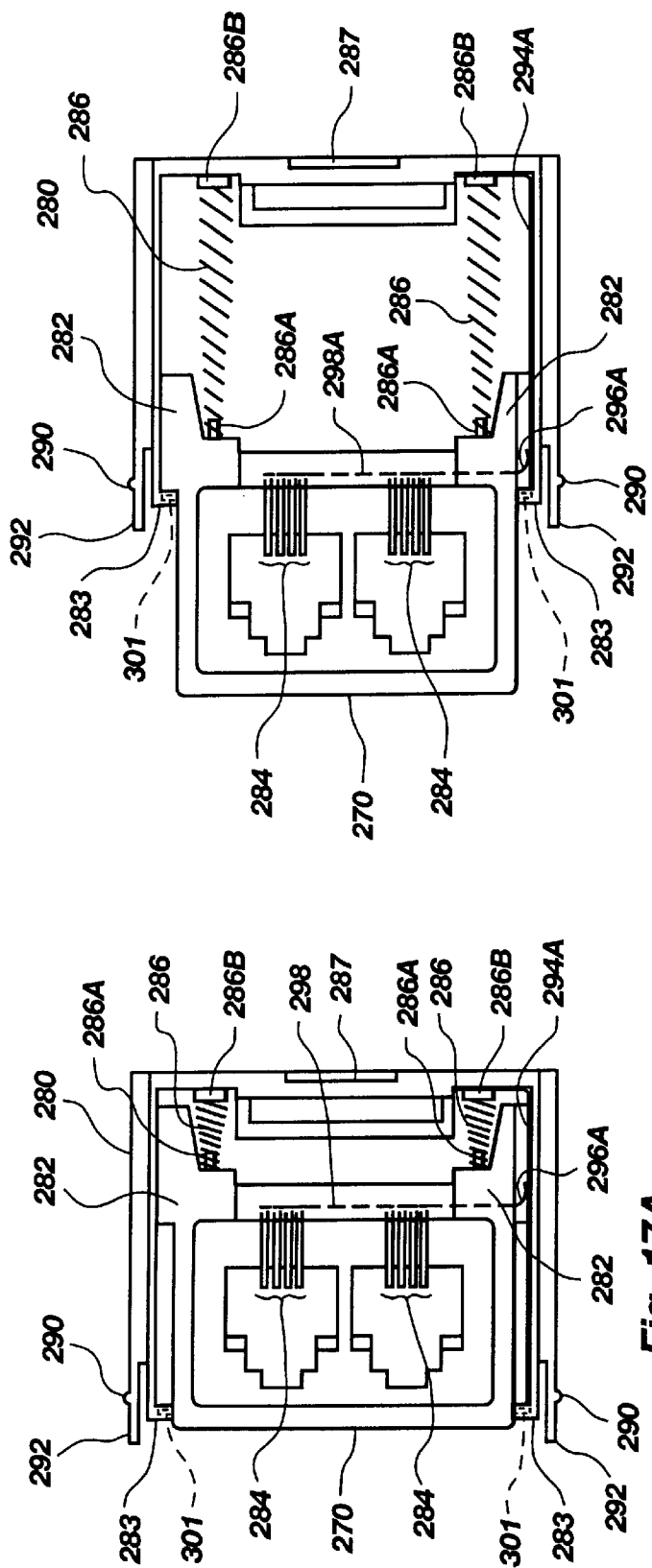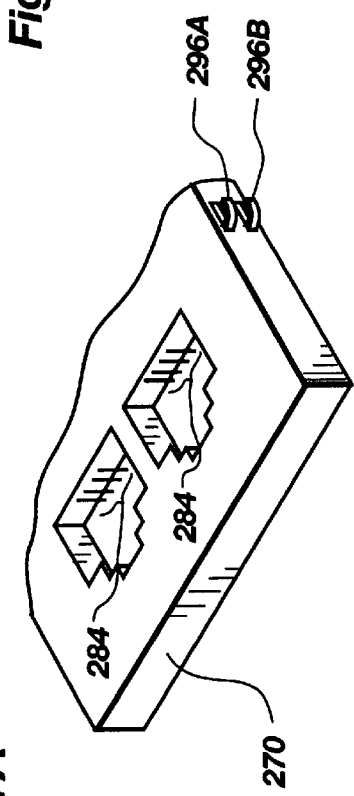

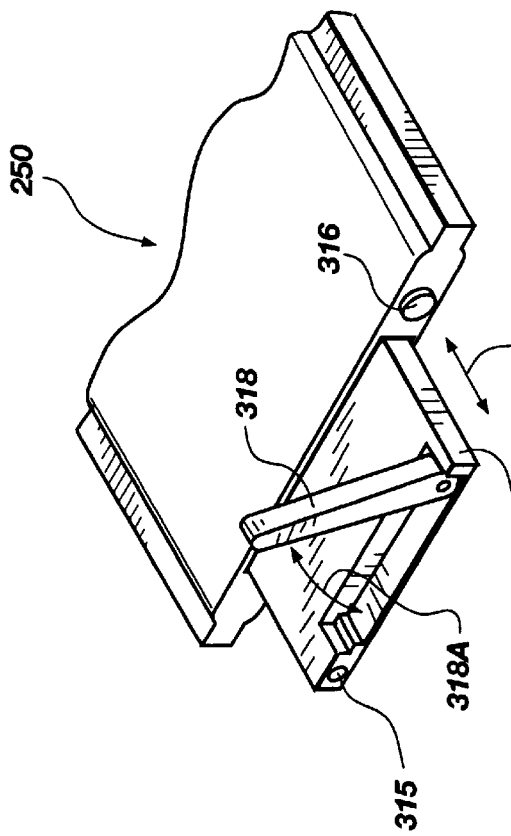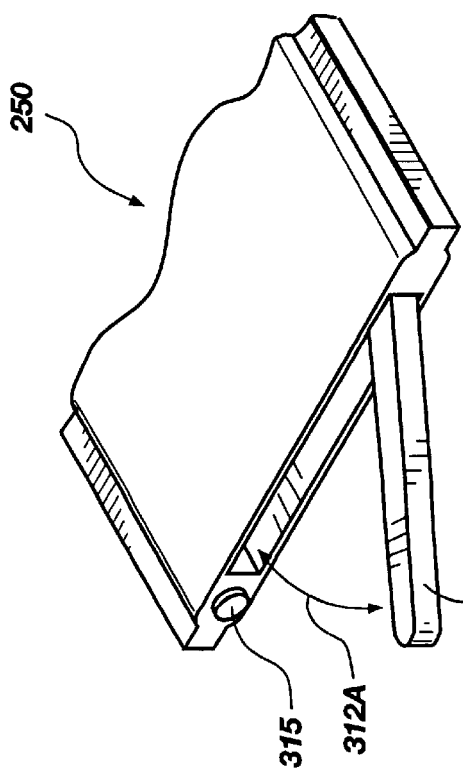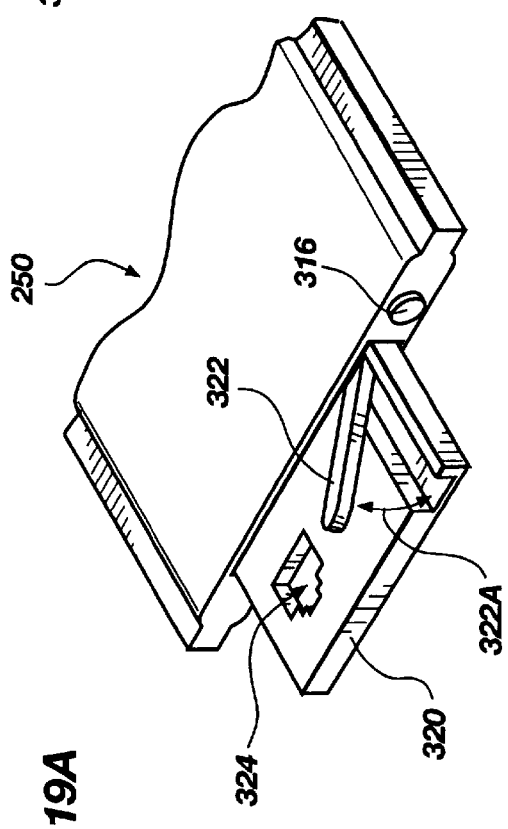

ADAPTABLE COMMUNICATIONS CONNECTORS

RELATED APPLICATIONS

This application is a continuation of U.S. patent application Ser. No. 08/799,799 filed on Feb. 13, 1997 entitled Adaptable Communications Connectors now U.S. Pat. No. 5,773,332, which is a continuation of U.S. patent application Ser. No. 08/402,084 filed on Mar. 10, 1995 (now abandoned) entitled Adaptable Communications Connectors which is a continuation-in-part of U.S. patent application Ser. No. 08/151,249 filed on Nov. 12, 1993 (now U.S. Pat. No. 5,411,405) entitled Miniature Electrical Communications Connectors.

BACKGROUND

1. The Field of the Invention.

This invention relates to electronic communication devices. More particularly, the present invention relates to connectors used to attach a communications line to a computer.

2. The Background Art.

Telecommunications services have become an integral part of modern society. The number of telephones in the United States alone exceeds 150 million. Moreover, communications within an organization between people and machines further increases the size of the communications network. The vast majority of the communications devices now in use require a wired connection to a communications line. Such communications devices include, for example, telephones, facsimile machines, modems, and local area network (LAN) adapters. Wireless communications, however, are becoming more commonplace in many instances.

In order to conveniently attach a communications line to a communications device, standard connectors have been promulgated. The most popular of these connectors is known in the art as the RJ-xx series of connectors. Of the RJ-xx series of connectors, the RJ-11, RJ-12, and RJ-45 connectors are widely used. The RJ-11 connector comprises a six contact plug and a corresponding jack which is standardized in the industrialized world. The conventional six contact RJ-11 connector has the desirable attributes of having both low cost and high reliability.

The RJ-11 connector is commonly used to attach a communications device such as a telephone, facsimile machine, or a modem (all of which may be integrated into a single device) to a communications line. Such devices are becoming smaller, so small that one or more dimensions of the customary RJ-11 jack, also referred to as a receptacle, is larger than a corresponding dimension of communications device. For example, communication devices which comply with the Personal Computer Memory Card International Association (PCMCIA), also referred to as PC Card, standards have dimensions of about 2.1 inches by about 3.4 inches with a thickness of only 3.5 mm, 5 mm, or 8 mm. Such small communications devices cannot incorporate customary RJ-xx series receptacles but still require compatibility with RJ-xx series plugs in order to attach to a communications line.

U.S. Pat. No. 5,183,404 to Aldous provides several schemes for providing a miniature RJ-11 compatible receptacle. Disadvantageously, many of the schemes set forth in Aldous leave the electrical contacts exposed to the surrounding environment. Thus, a user may come in contact with the electrical contacts of the plug, which in the U.S. may carry more than 80 volts. Further, since the contacts of the RJ-11 plug are exposed, the contacts may be inadvertently shorted together. Thus, the scheme included in the Aldous reference presents a danger of electrical shock and electrical short circuit. Moreover, some of the receptacle schemes disclosed in the Aldous reference are particularly prone to breakage and damage because of inherently weak structures.

Thus, it would be an advance in the art to provide a miniaturized communications line connector which overcomes these drawbacks.

BRIEF SUMMARY AND OBJECTS OF THE INVENTION

In view of the above described state of the art, the present invention seeks to realize the following objects and advantages.

It is a primary object of the present invention to provide a communications line receptacle for use with a miniaturized communications device wherein the electrical contacts are shielded or isolated from the surrounding environment.

It is also an object of the present invention to provide a miniaturized communications line connector which is resistant to breakage and which can be stored out of the way when not being used.

It is a further object of the present invention to provide a communications line receptacle which is readily replaceable if broken.

It is another object of the present invention to provide a communications card which can be readily adapted to meet various communications standards.

It is a further object of the present invention to provide a communications card which can provide wireless communications.

These and other objects and advantages of the invention will become more fully apparent from the description and claims which follow, or may be learned by the practice of the invention.

The present invention provides an apparatus for receiving an RJ-xx series plug and making electrical connection with at least two conductors on the plug and conveying any signals on the conductors to a communications device such as a telephone, facsimile machine, modem, local area network adapter, or some other device.

The apparatus includes a body, also referred to as a body means. A recess, or recess means, is provided on the body. In some embodiments the recess means preferably includes an open first end and a closed second end. In other embodiments, the recess means preferably includes open first and second ends. The recess means preferably has dimensions such that the plug is closely received therein. A means is also provided for releasably engaging the plug such that the plug is releasably held in the recess.

At least first and second electrical conductors are provided in the recess. Each of the electrical conductors are positioned such that they have electrical continuity with the electrical contacts in the plug when the plug is received into the recess. A means for conveying any electrical signal present on the electrical contacts to the communications device is also provided.

A replaceable direct access arrangement unit allows the communications card to be interfaced with telephone systems, or other communications systems, which may each require adherence to a different standard. When necessary, a user merely replaces an existing direct access arrangement unit with another direct access arrangement unit which is compatible with the wired telephone system or the wireless communications system that is available to the user.

Also preferably included with the recess means is an expandable means for isolating the contacts in the plug from electrical continuity with an object in a surrounding environment such that passage of current from one or more of the electrical contacts to an object present in the surrounding environment is prevented. The expandable means is located at the second end of the recess and is preferably a stretchable membrane. The expandable means expands to accommodate a plug received in the recess and tends to return, and can be returned by a user, to a position within the thickness of the body when not being used so the apparatus assumes a compact configuration.

Embodiments of the present invention include receptacle modules which receive an RJ-xx series plug. One preferred embodiment of the present invention includes a means for holding the body which receives the RJ-xx series plug. The means for holding the receptacle body or the receptacle module can be easily installed in and removed from the communications device by the user. The present invention allows the body to be retracted into and extended from the communications device while still allowing easy removal and replacement of the body making up the receptacle module. Another preferred embodiment of the present invention includes means for pivotally rotating the body into and out of the communications device such that the body is substantially entirely within the communications device when not being used and the body is rotated to a position where the recess which receives the plug is accessible to the user when desired.

BRIEF DESCRIPTION OF THE DRAWINGS

In order to better appreciate how the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which:

FIG. 6 is a perspective view of a third embodiment of the present invention with a removable receptacle module illustrated in a retracted position.

FIG. 7 is a perspective view of the third embodiment of the present invention represented in FIG. 6 with the removable receptacle module illustrated in an extended position.

FIG. 8 is a top plan view of the removable receptacle module represented in FIG. 7.

FIG. 9 is a top plan view of the removable receptacle module represented in FIG. 6.

FIG. 14 is a perspective view of a sixth embodiment of the present invention having a replaceable direct access arrangement unit ready to be inserted into the communications card.

FIG. 14A is an end view taken along line 14A—14A of FIG. 14.

FIG. 14F is a top view of a communications card having another replaceable direct access arrangement unit installed therein.

FIGS. 15A and 15B are top views showing the electrical interconnection between the receptacle module and the replaceable direct access arrangement (not shown in these figures) and the accompanying mechanism which retracts and extends the receptacle module into and out of the replaceable direct access arrangement.

FIG. 15C is a detailed side view of the electrical interconnection circuit between the receptacle module and the frame.

FIG. 15D is a detailed perspective view of the electrical interconnection circuit between the receptacle module and the frame.

FIGS. 17A and 17B are top views showing the electrical interconnection between the receptacle module and the replaceable direct access arrangement and the accompanying mechanism which retracts and extends the receptacle module into and out of the replaceable direct access arrangement.

FIG. 17C is a detailed perspective view of the electrical interconnection circuit between the receptacle module and the frame represented in FIGS. 17A–B.

FIGS. 19A–C are perspective views of three different antenna configurations which may be included in embodiments of the present invention.

DETAILED DESCRIPTION OF THE PREFERRED EMBODIMENTS

Reference will now be made to the drawings wherein like structures will be provided with like reference designations.

Figure 1:
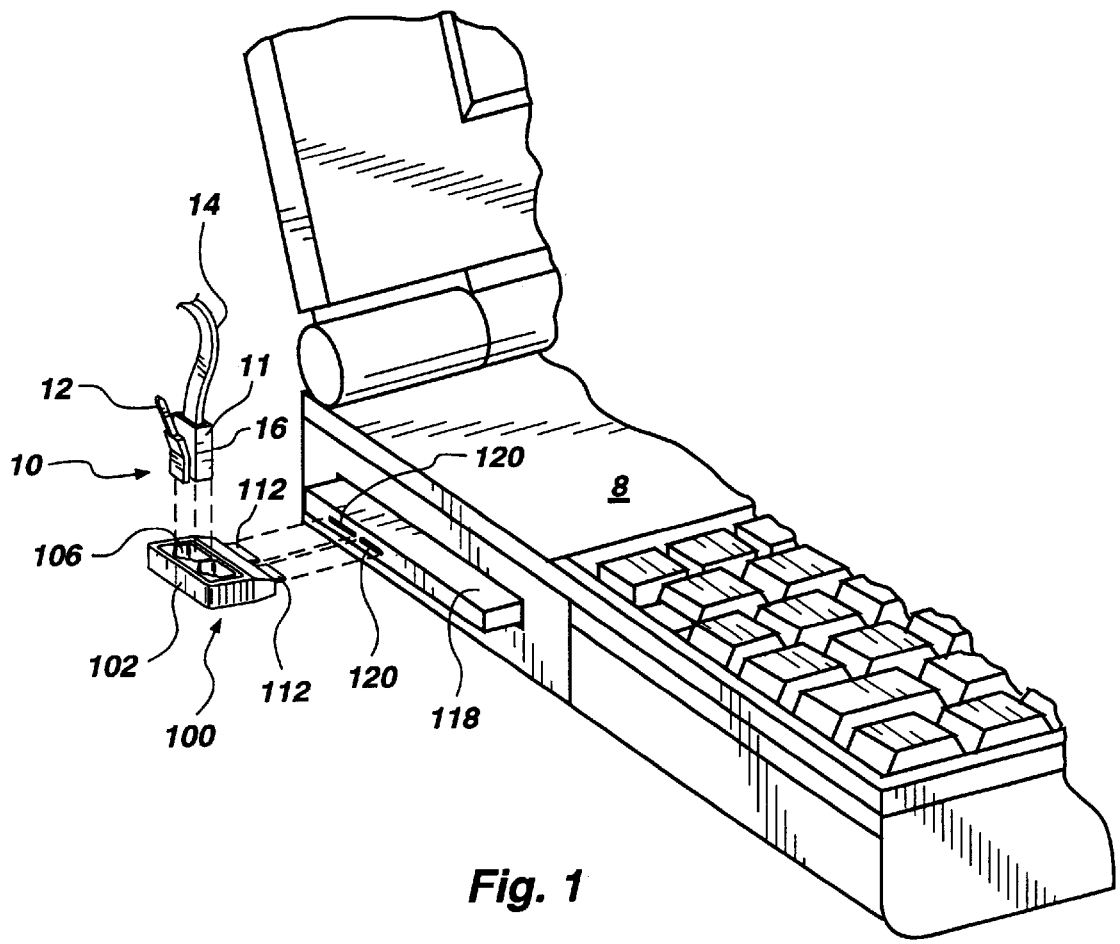
FIG. 1 is a partial perspective view of a lap top computer with a communications card partially inserted therein and a first embodiment of the present invention ready to be coupled to the communications card.

As is evident to those skilled in the art, advances in technology is allowing many different electrical devices to be made smaller than was contemplated just a few years ago. Represented in FIG. 1 is a partial perspective view of a lap top computer 8. In order to meet the demand for devices utilized with such lap top computers without adding any significant weight or bulk, devices such as a modem card 118 (shown partially withdrawn from the lap top computer 8) which complies with the PCMCIA (also known as PC Card) standards have been produced. Significantly, while most lap top computers are generally note book size (about 8.5 inches by about 11 inches), the need for further miniaturization of devices such as the modem card 118 will increase as computing devices of all kinds continue to shrink.

The modem card 118 can also represent numerous other communication devices, for example, a local area network adaptor, voice mail device, or a facsimile device. Indeed, with the continuing trend of miniaturizing such devices, all of these devices may be combined into one card the size of the modem card 118 represented in FIG. 1. All of these devices are examples of those intended to come within the scope of the meaning of the term "communication devices" as used herein. Even further, other devices which require communication with one or more additional devices which are now available or which may become available in the future are intended to also come within the meaning of the term communication devices as used herein.

As used herein, the term "data utilization device" is intended to include all digital computing devices which are adaptable to receive data or instructions via a communications medium. Perhaps the most common current example of such a device is the personal computer.

Figure 3:
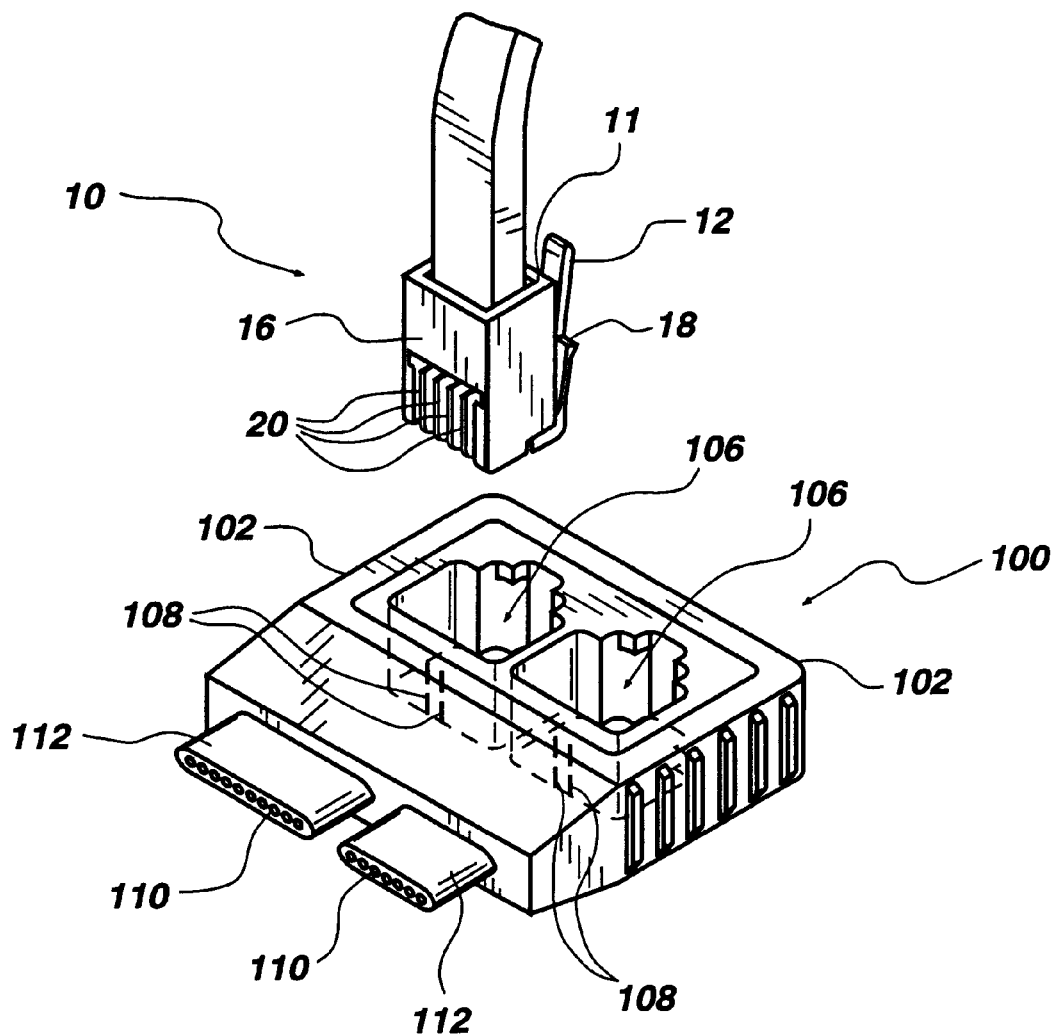
FIG. 3 is a reverse perspective view of the first embodiment of the present invention represented in FIG. 1.

A plug, which is compatible with the RJ-xx series industry standard, is indicated generally at 10 in FIGS. 1 and 3. The RJ plug 10 includes a block 11 which has a first face 16 into which a plurality of electrical contacts 20 are recessed. The electrical contacts 20 are connected to wires (not represented) contained within a cable 14 which lead to the communications network, to another communications device, or other device. A biased clip 12, which is integrally molded as part of the block 11, is used to hold the plug in a corresponding receptacle.

Detailed information regarding the RJ-xx series of connectors can be found in the publication found at Title 47 (Telecommunications), Code of Federal Regulations, Chapter I (Federal Communications Commission), Subchapter B (Common Carrier Services), Part 68 (Connection of Terminal Equipment to the Telephone Network), Subpart F (Connectors), Section 68.500 (1992) which is now incorporated herein by reference in its entirety.

Figure 2:
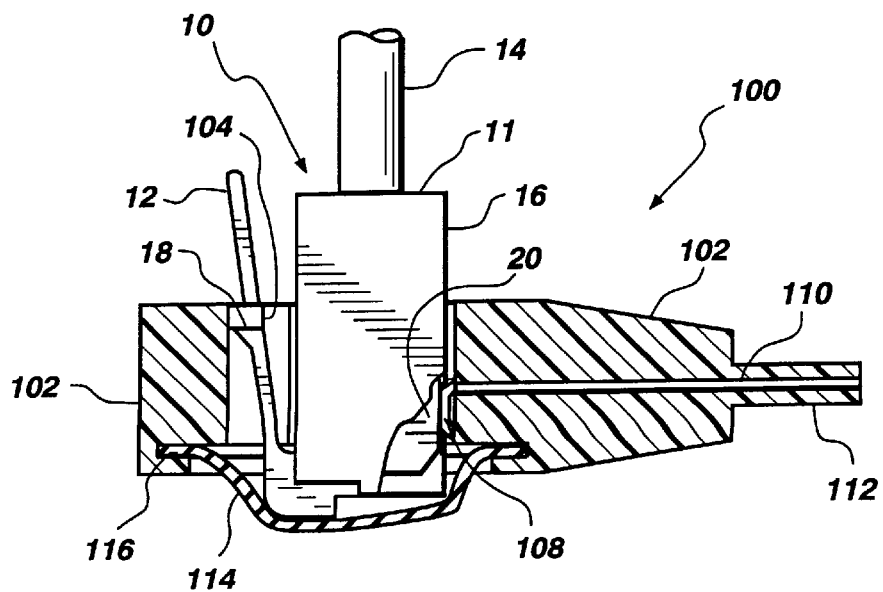
FIG. 2 is a cross sectional view of the first embodiment of the present invention represented in FIG. 1.

FIGS. 1–3 represent a first preferred arrangement of the present invention embodied in a receptacle module generally represented at 100. The receptacle module 100 includes a male coupling 112 which provides both physical and electrical connections to a corresponding female coupling 120 provided in the modem card 118. It will be appreciated that many different structures available in the industry provide equivalent functions to the male coupling 112 and the female coupling 120.

The receptacle module 100 includes a body 102 which can preferably be fabricated from a plastic material using techniques known in the art but can also be fabricated using any suitable materials and techniques now available or which may become available in the future. Two recesses, both of which are generally indicated at 106 in FIG. 3, are formed in the body 102. The inclusion of two recesses 106 desirably allows accommodation of two communication lines by the receptacle module 100.

A cross sectional view of one of the recesses 106 is provided in FIG. 2. FIG. 2 also shows the plug 10 inserted into the recess 106. The recess 106 has a first open end and a second closed end. When an RJ-xx series plug is inserted into the recess 106, a plurality of conductors 108 communicates with one of its respective contacts 20. The conductors 108 are preferably spring-like so that they are in firm electrical continuity with the contacts 20. In some applications only two conductors 108 are provided while more than two conductors 108 are provided in other applications. Each of the conductors 108 is joined to a respective hollow pin, one of which is shown in cross section at 110, which mates with corresponding pins provided in the female coupling (120 in FIG. 1).

It will be appreciated that the number of pins and conductors can be varied in accordance with the particular application for the receptacle block. Moreover, it is within the scope of the present invention to utilize any techniques now available, or which become available in the future, to provide electrical connection between the conductors in the recesses and the coupling structure.

Still referring to FIG. 2, as the plug 10 is received into the recess, a ledge 104 provided on the biased clip 12 engages a ridge 18 formed on the body 102 and protrudes into the recess 106. The biased clip 12 and the ledge 104 cooperate to hold the plug 10 in the recess 106. When removal of the plug 10 is desired, the biased clip 12 is compressed and the plug 10 is removed from the recess 106.

Enclosing one end of the recess is an expandable member 114. In the embodiment of the invention represented in FIG. 2, the expandable member is an elastic and stretchable membrane. The expandable member 114 is preferably a rubber-like material which is an electrical insulator. The expandable member 114 is anchored in a groove 116 provided in the body 102 around the recess 106.

As clearly shown in the cross section of FIG. 2, when the plug 10 is fully inserted into the recess 106 the expandable member 114 is moved to expand the depth of the recess 106. The expandable member 114 isolates the contacts 20 from exposure to the surrounding environment. If the expandable member 114 were not included, as in the previously available schemes, the contacts 20 would be exposed to the surrounding environment and the possibility that the contacts 20 will be shorted together is present. It is also possible that the contacts 20 could be shorted to an electrical ground, pass a current to a user who touches the contacts 20, or some other event might occur which would damage the communications devices attached to the cable 14. As known in the art, voltages of more than 70 volts regularly are present on the contacts 20 when connected to the common carrier telephone network in the United States.

The illustrated expandable member 114 is preferably fabricated from a rubber-like material which is flexible enough to allow the end of the plug 10 to expand the flexible member 114 without undue force being exerted on the plug 10. The material from which the expandable member 114 is fabricated should be strong enough to allow long time use without any failure, e.g., tearing. Those skilled in the art will appreciate that the perimeter of the expandable member 114 should be securely anchored in the groove 116.

It is to be understood that structures other than the expandable member 114 can function as the expandable means for isolating the contacts 20 from electrical continuity with any object in the surrounding environment. For example, a combination of rigid panels joined together to allow expansion can function as the expandable means. Further, a combination of rigid elements and elastic elements, or one or more rigid elements which fold within the thickness of the body 102, can be devised using the information contained herein. It is preferred that the thickness of the body 102 be not greater than the thickness of the modem card 118. Thus, the expandable member 114 should tend to automatically return to within the plane of the body 102 once the plug 10 is removed and/or allow the user to collapse the expandable member 114.

Referring to FIG. 3, it is preferred that the recesses 106 have particular dimensions. It is preferred that the two unbroken side walls of the recess each have a length in the range from about 0.265 inches to about 0.285 inches and the single remaining straight wall, which is perpendicular to the two side walls, have a dimension in the range from about 0.45 inches to about 0.475 inches for compatibility with RJ-45 plugs. It is also preferred that the two unbroken side walls of the recess have a length in the range from about 0.265 inches to about 0.285 inches and the single remaining straight wall, which is perpendicular to the two side walls, have a dimension in the range from about 0.375 inches to about 0.4 inches for compatibility with RJ-11 and RJ-12 plugs.

Figure 4:
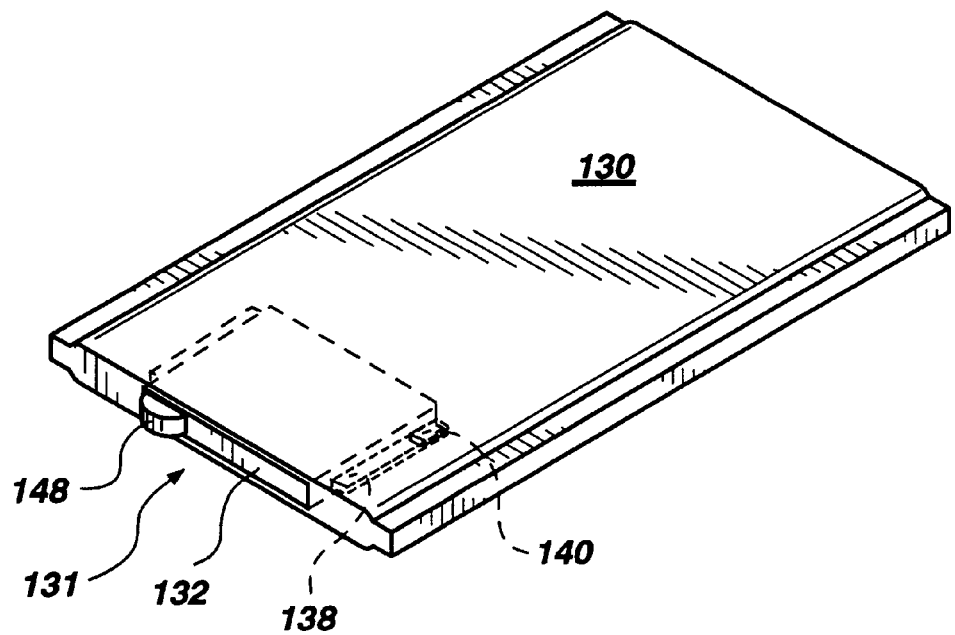
FIG. 4 is a perspective view of a second embodiment of the present invention with a receptacle module illustrated in a retracted position.

FIG. 4 is a perspective view of a second embodiment of the present invention with a receptacle module, generally represented at 131. The receptacle module 131 is illustrated in FIG. 4 as being retracted into a communications card 130. The communications card 130 can house any of the communications devices indicated earlier.

The receptacle module 131 includes a body 132 and a finger pull 148 formed thereon. The receptacle module 131 is conveniently kept in its retracted position illustrated in FIG. 4 until the communications card 130 needs to be connected to a communications line (not shown in FIG. 4). When needed, the user grasps the finger pull 148 and pulls the receptacle module 131 to its extended position represented in FIG. 5.

Figure 5:
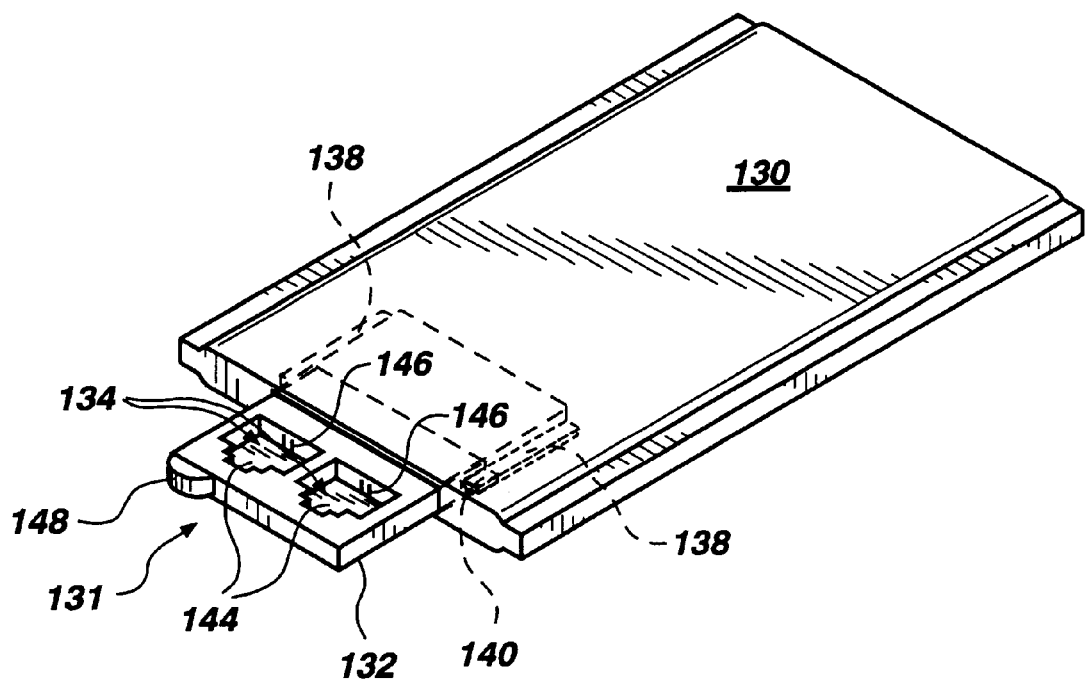
FIG. 5 is a perspective view of the second embodiment of the present invention represented in FIG. 4 illustrated in an extended position.

FIG. 5 illustrates the receptacle modules in its extended position. The receptacle module 131 includes a pair of ridges (one shown in phantom image at 140 in FIGS. 4 and 5) which extend from the sides of the receptacle module 131 and which slide along a pair of grooves, shown best in phantom image in FIG. 5 at 138.

The receptacle module 131 includes two recesses, each generally indicated at 134, with each recess including a plurality of conductors 146. Each recess 134 also preferably includes an expandable member 144 which can be identical, similar, or equivalent to the expandable member 114 discussed in connection with FIGS. 1–3.

FIG. 6 is a perspective view of a third embodiment of the present invention including a removable receptacle module generally represented at 151. The removable receptacle module 151 is shown in place in a communications card 150 as has been explained earlier. The removable receptacle module includes a body 166 which is illustrated in FIG. 6 in a retracted position. It will be appreciated that the retracted position illustrated in FIG. 6 can be used or the body 166 can be fully withdrawn into the communications card 150 housing. In order to use the apparatus, a user preferably grasps finger grips 166 and pulls the body 166 out to an extended position as represented in FIG. 7.

The removable receptacle module 151 is advantageously easily removable from the communications card 150. In order to remove the entire removable receptacle module 151 from the communications card 150, a pair of wings 158 are squeezed inwardly so a ledge (158 in FIG. 8) provided on each wing 158 disengages from an edge 162 of the communications card 150 housing. The entire removable receptacle module 151 can then be removed from the communications card 150. It will be appreciated that other structures can carry out the function of the wings 158, as will be explained later in this disclosure.

It is common for a receptacle module, such as receptacle module 100, to be broken or damaged during use. If a receptacle module, or other structure providing connection to a communications line is permanently affixed to the communications card or its equivalent, then the only practical recourse is replacement of the entire communications card, even though only the receptacle module has been damaged. The embodiment of the present invention represented in FIGS. 6–9 provides that the receptacle module can be easily replaced in case of damage.

Moreover, the removable receptacle module 151 can be replaced with another removable receptacle module which is adapted to receive another size or style of plug (not represented in FIGS. 6–9). For example, the RJ-11, RJ-12, and RJ-45 connectors have all been generally adopted for specialized applications. Thus, a removable receptacle module adapted for use with RJ-11 plugs can be easily replaced with a removable receptacle module adapted for use with RJ-45 plugs and so forth.

FIGS. 8 and 9 provide detailed views of the removable receptacle module 151 with the body 166 in an extended and retracted position, respectively. Provided in the body 166 are a pair of recesses, generally indicated at 154, and a plurality of conductors 156. Each recess 154 preferably includes an expandable member, generally indicated at 154, as has been previously explained.

As represented in FIGS. 8 and 9, the removable receptacle module 151 includes a shell 168 from which the wings 156 extend and in which the body 166 slides. It will be appreciated that many different structures can be devised by those skilled in the art to carry out the functions of the shell using the teachings contained herein. Attached to the body 166 are three guides 172 which slide within three respective grooves 170. The guides 172 and the grooves 172 are configured so that the body 168 is held captive in, i.e., cannot be completely removed from, the shell 168. Also represented in FIGS. 8 and 9 are a plurality of electrical conductors indicated at brackets 174 which mate with suitable structures within the communications card 150 housing to allow transfer of signals between the communications line (not illustrated in FIGS. 8 and 9) and the communications card (150 in FIGS. 6 and 7).

It will be appreciated that since the housing 168 of the receptacle module 151 is retained within the communications card 151, and that the communications card 150 is held within a lap top computer or a cabinet of some kind, the shell 168 is protected from breakage and damage so it can be removed without undue difficulty even if damage does occur to other components of the removable receptacle module 151.

Figure 10:
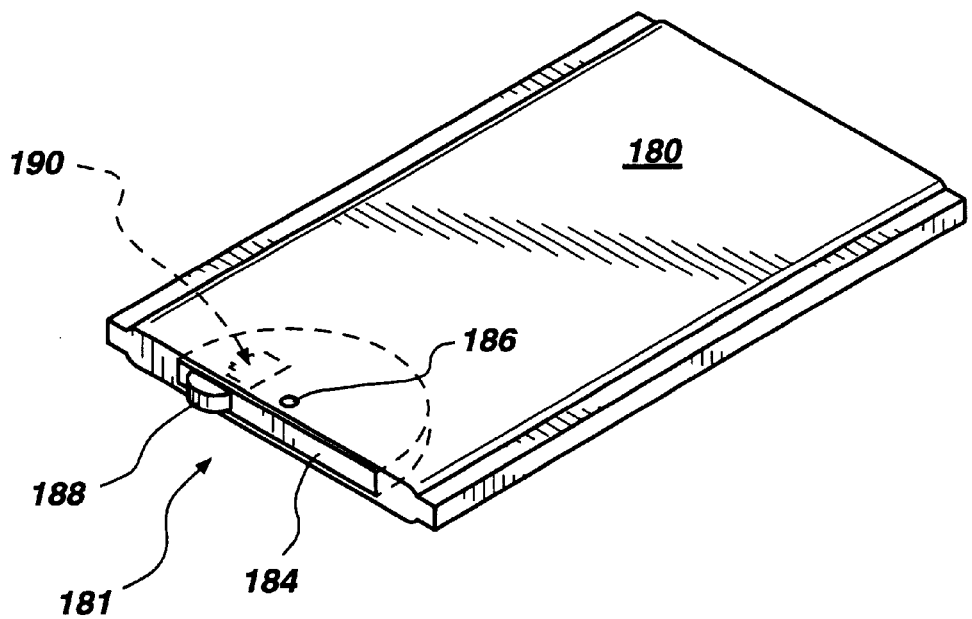
FIG. 10 is a perspective view of a fourth embodiment of the present invention with the receptacle module illustrated in a retracted position.

FIG. 10 provides a perspective view of a fourth embodiment of the present invention. The embodiment illustrated in FIG. 10 includes a receptacle module, generally indicated at 181, illustrated in a retracted position. The receptacle module 181 includes a body 184 which is preferably semicircular in shape and rests, when in its retracted position, within a cavity in a communications card 180, the cavity being generally indicated at 182 in FIG. 11. The cavity 182 is preferably semicircular in shape but can be any shape which provides sufficient room to accommodate the body 184 in its retracted position.

Figure 11:
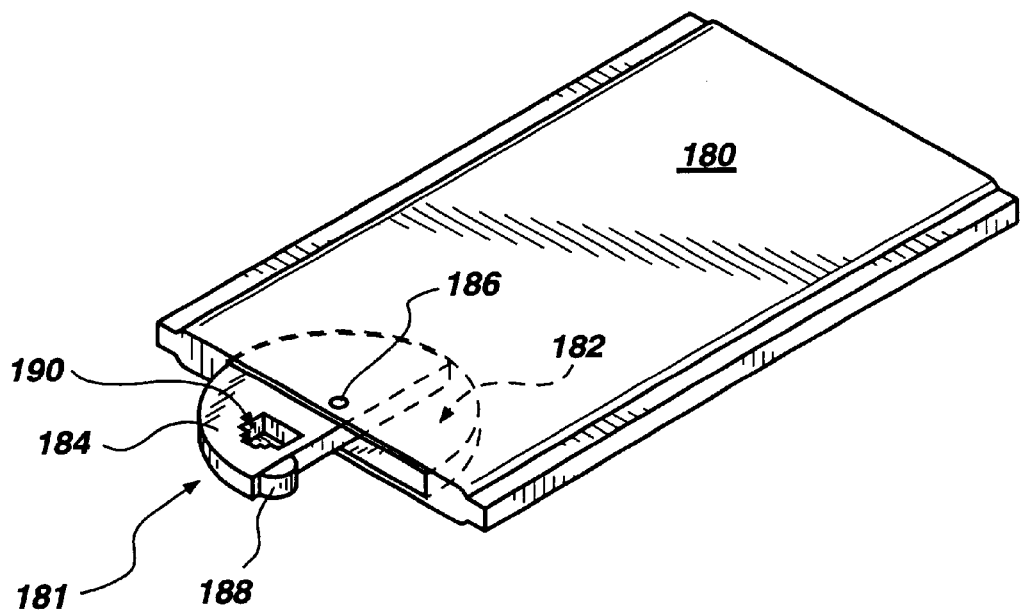
FIG. 11 is a perspective view of the fourth embodiment of the present invention represented in FIG. 10 with the receptacle module illustrated in an extended position.

The body 184 is attached to the communications card 180 housing by way of a pivot 186. The pivot 186 allows the body 184 to be rotated by pulling on a finger grip 188 to an extended position as illustrated in FIG. 11. In its extended position, the receptacle module 181 allows access to a recess 190 which is preferably configured as explained earlier and is ready to receive a plug, such as plug 10 in FIG. 1. Electrical connections between the conductors (not illustrated) disposed in the recess 190 and the circuitry contained in the communications card 190 are provided as can be designed by those skilled in the art. Those skilled in the art can also arrive at numerous structures which are equivalent to those illustrated in FIGS. 10 and 11 using the teachings contained herein.

Figure 12:
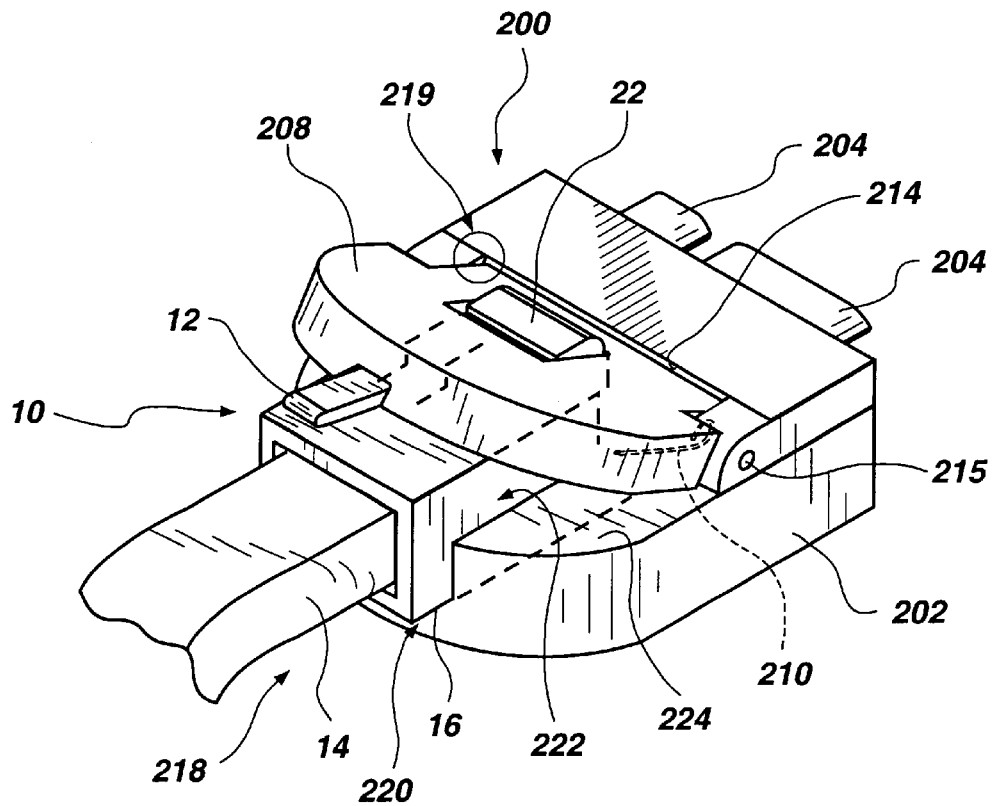
FIG. 12 is a perspective view of a fifth embodiment of the present invention.

FIG. 12 provides a perspective view of a fifth embodiment of the present invention which includes a receptacle module, generally indicated at 200, with male couplings 204 similar to those represented in FIGS. 1–3 at 112 and which are received by a communications card such as those described earlier. A body 202 is provided with a recess into which the plug 10 is inserted. As illustrated best in the cross sectional view of FIG. 13, a plurality of conductors 206 are provided which communicate with respective contacts 20 on the plug 10.

Figure 13:
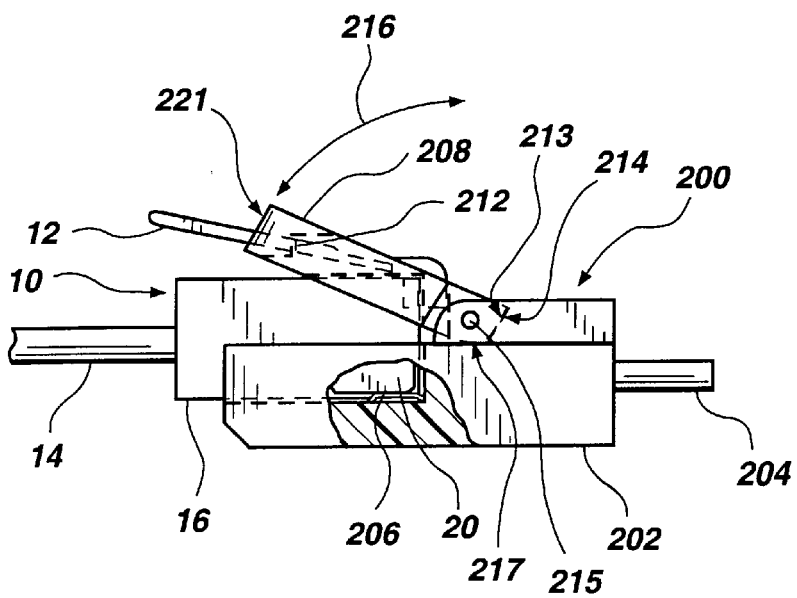
FIG. 13 is a side elevational view of the fifth embodiment of the present invention represented in FIG. 12.

With the plug 10 in position on the body 202, a lever 208 holds the plug 10 in place. Lever 208 is pivotally attached to body 202 by an axle 215 (see FIGS. 12 and 13). In FIG. 13, arrow 216 indicates the general directions of rotation of lever 208 about axle 215, thereby moving an end, generally indicated at 221, of lever 208 toward and away from body 202. The lever 208 is biased toward the body 202 by a spring 210. The spring 210 is one example of a means to restrain over-rotation of lever 208. Over-rotation of lever 208 significantly beyond the approximately 45 degrees position illustrated in FIGS. 12 and 13 would inherently and undesirably uncouple the electrical connection formed between the contacts 20 of plug 210 and conductors 206 of body 202 (see FIG. 13). Spring 210 provides an increased resisting force having a value corresponding to a rotation displacement, where the force is directed to counter the rotation displacement of lever 208. A ledge 212 provided on the lever 208 engages the ridge (18 in FIGS. 2 and 3) provided on the clip 12 to further hold the plug in place. An example of a more positive stop to restrain over-rotation of lever 208 is illustrated best in FIG. 13. The more positive stop is created by a structural interference which occurs at about the maximum desired rotation angle of lever 208. The approximately maximum desired rotated orientation is illustrated in FIGS. 12 and 13. In this orientation, corner 213 of lever 208 structurally interferes with the surface 214 of body 202, thereby preventing further rotation of lever 208 about axle 215. The sloped configuration and arrangement of surface 214 is clearly indicated at the circled corner, generally indicated at 219, in the perspective view illustrated by FIG. 12. Referring now to FIG. 13, a corner, generally indicated at 217, of lever 208 is located opposite corner 213. Corner 217 is illustrated as having a radius to rotate about axle 215 without interfering with surface 214. In the absence of a plug 10, lever 208 may therefore rotate in a direction indicated by arrow 216 toward a closed position in engagement with body 202.

The illustrated device of FIGS. 12 and 13 provides examples of a means to restrict rotation of lever 208 away from body 202 in one direction indicated by arrow 216. At the illustrated rotation angle of about forty-five degrees (best seen in FIG. 13), lever 208 in combination with structure carried by body 202 forms a recess to receive a RJ-series plug 10. Over-rotation of lever 208 would destroy the recess required to closely receive a plug 10 in mating electrical contact with conductors 206 carried in body 202. An aperture is provided on the lever 208 to accommodate a hump 22 which is provided on plugs which comply with the RJ-xx series standards. A first opening 218, spanning the width of plug 10, is formed on face 220 of body 202 to receive a portion of plug 10 therethrough in sliding engagement. A second opening 222, adjacent first opening 218, is formed on surface 224 of body 202 to accommodate the inserted length of plug 10. It will be appreciated that the biased lever provides a much more secure and convenient to use apparatus than any of those available in the art which are suitable for use with RJ-xx series plugs and which is suitable for use with miniaturized devices such as the previously described communications cards.

Reference will next be made to FIG. 14. FIG. 14 provides a perspective view of a preferred sixth embodiment of the present invention. The embodiment of FIG. 14 provides a communications card 250 which includes a replaceable direct access arrangement 258 which is shown ready to be inserted into the communications card 250. As is known in the industry, the communications card 250 makes electrical connection to a computing device via connector sockets, which are represented at 252 in FIG. 14.

The inclusion of a replaceable direct access arrangement, also referred to as a data access arrangement (abbreviated "DAA"), provides important advantages not previously available in the industry. In the past, DAAs provided a few functions such as: matching the impedances between the telephone line and the modem; receiving data from the telephone line; transmitting data onto the telephone line; providing a pulse dial; and detecting an incoming ring signal. Significantly, different countries and regions of the world require that the DAA carry out different functions.

Presently, it has become a practice in the industry to supply a DAA with a modem in accordance with whatever country the user intends to make the connection to a telephone line, i.e., "U.S." modems are sold in the U.S. and "German" modems are sold in Germany. Since desktop personal computers are very seldom moved from country to country, it has been satisfactory in the past to purchase a modem which can be used in only one country; if the user moved, a new modem was purchased if necessary.

Significantly, the widespread popularity of portable personal computers, and the use of PCMCIA cards in desktop computers, has meant that the computer or the computer peripheral is not bound to any particular location but can travel to any location in the world. Unfortunately, the industry has not recognized, and has not begun to effectively solve, the problems faced by a portable computer user traveling from country to country. Available telephone communication devices are ill suited for use in one or more countries which a user might visit. Even if the desirability of providing a telephone communication device and DAA which is suitable for use in multiple countries was recognized in the industry, the requirements of some countries mandate the use of components which seem too large to allow their incorporation into a communications card which is used with a portable computer.

The present invention solves these problems found in the industry by including a replaceable DAA 258 which is received into a cavity which is generally indicated at 254 in FIG. 14. The replaceable DAA 258 not only can carry out the customary functions already known in the art, but in accordance with the present invention the replaceable DAA 258 can also carry out other desirable functions as described herein.

The replaceable DAA 258 preferably makes electrical connection with the communications card 250 via twenty connector pins 256 provided in the back of the cavity 254 and corresponding connector sockets 260 provided on the rear of the DAA 258. As necessary, a user can install an appropriate replaceable DAA 258 to perform the functions necessary to obtain direct connection to a country's telephone system or to perform some other function.

It will be appreciated, and as will be explained shortly, the replaceable DAA 258 can house components different than those necessary to connect to a telephone line such as providing the components necessary to interface with a computer network or provide wireless communication service such as cellular telephone service or carry out some other function.

Represented in FIG. 14 are grooves 255 into which are received respective ridges 262 provided on the sides of the replaceable DAA 258. The grooves 255 are more clearly represented in the end view of FIG. 14A. The grooves 255 and the ridges 262 function to guide the replaceable DAA 258 into and out of the cavity 254. The replaceable DAA 258 is preferably held in the cavity 254 by a pair of flexible ledges 264 which engage corresponding notches 257 provided on the inner surface of the cavity 254. FIG. 14B illustrates the communications card 250 when the replaceable DAA 258 is fully inserted into the cavity 254.

To remove the replaceable DAA 258 from the remainder of the communications card 250, a pair of tabs 266 are squeezed, resulting in the ledges 264 being released from the notches 257, and allowing the replaceable DAA 258 to be extracted from the cavity 254. It will be appreciated that many different arrangements can be arrived at by those skilled in the art to allow the components of the replaceable DAA 258 to be connected to, and removed from, the remainder of the communications card 250.

The replaceable DAA 258 illustrated in FIG. 14 is provided with a receptacle module 270 which is provided with a pair of RJ-xx series receptacles represented at 278A&B which are adapted to connect to a communications line having a RJ-xx series plug such as those represented in FIGS. 1–3. It will be appreciated that the RJ-xx series receptacles 278A&B can be provided with the expandable member 114 shown in FIG. 2 if desired. It is within the scope of the present invention to provide the receptacle module 270 with structures to allow its removal as shown in FIG. 1 or to include structures to allow extension out of, as shown by the phantom image of FIG. 14, the replaceable DAA 258 and retraction into the replaceable DAA 258 in the direction of arrow 272 as represented in FIG. 14B.

Figure 14B:
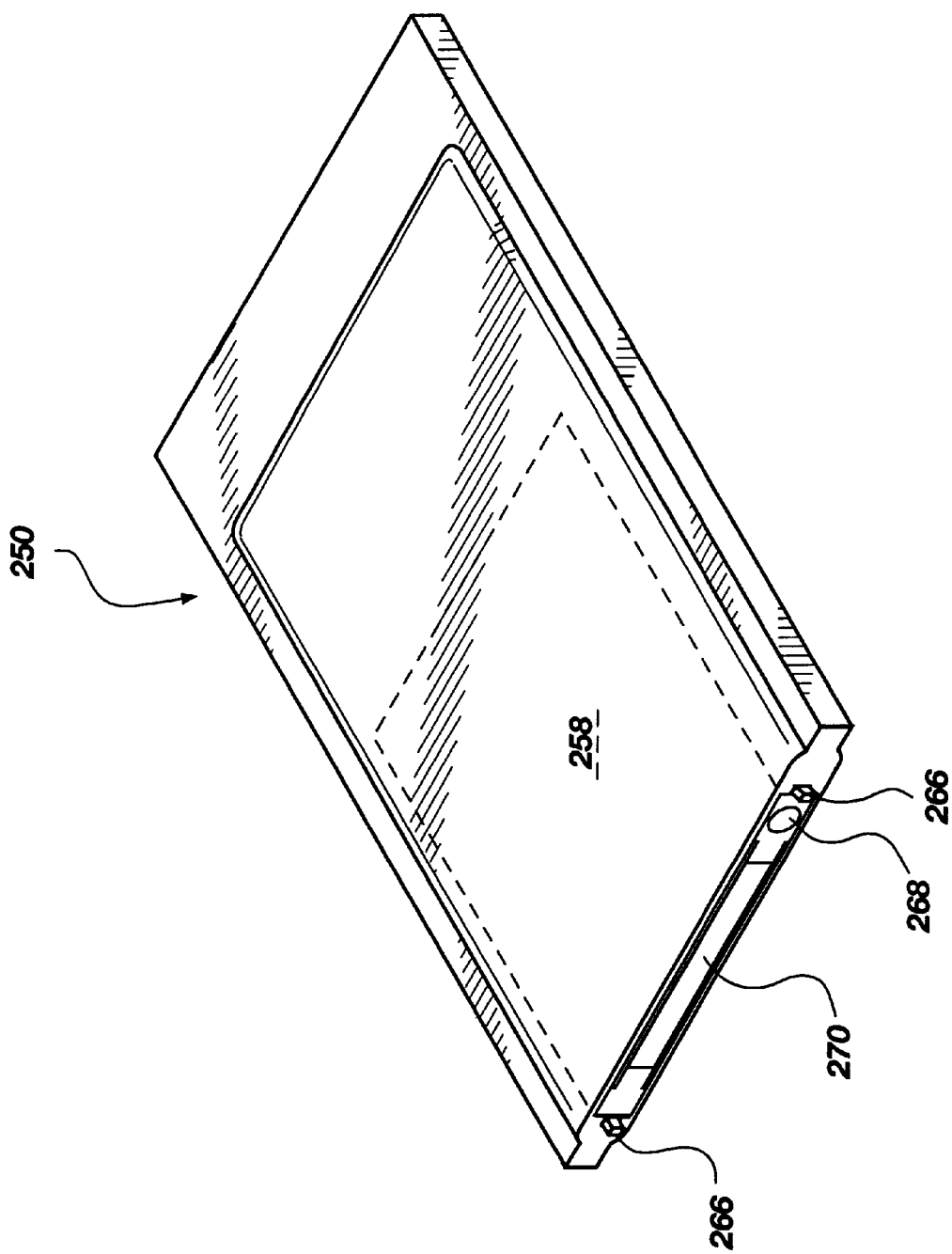
FIG. 14B is a perspective view of the embodiment illustrated in FIG. 14 showing the components retracted into the communications card.
Figure 14C:
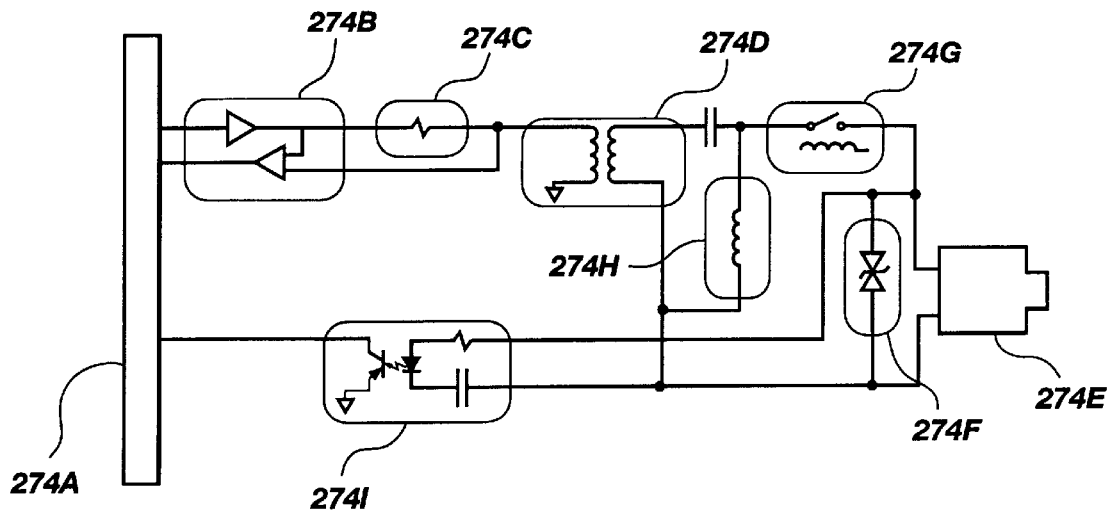
FIGS. 14C–E are block diagrams illustrating the preferred functions carried out by the replaceable direct access arrangement unit.
Figure 14D:
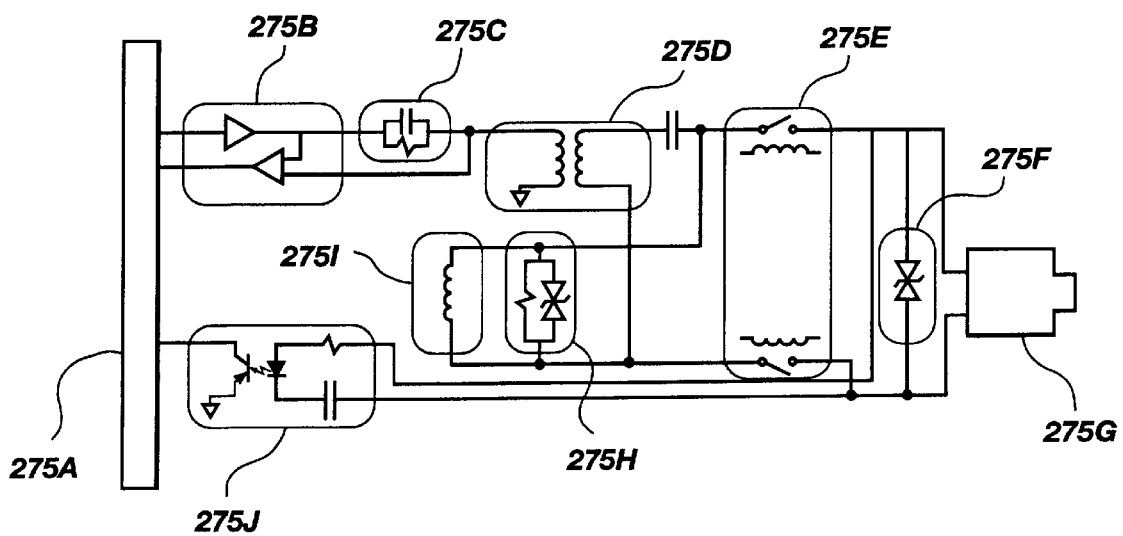
Figure 14E:
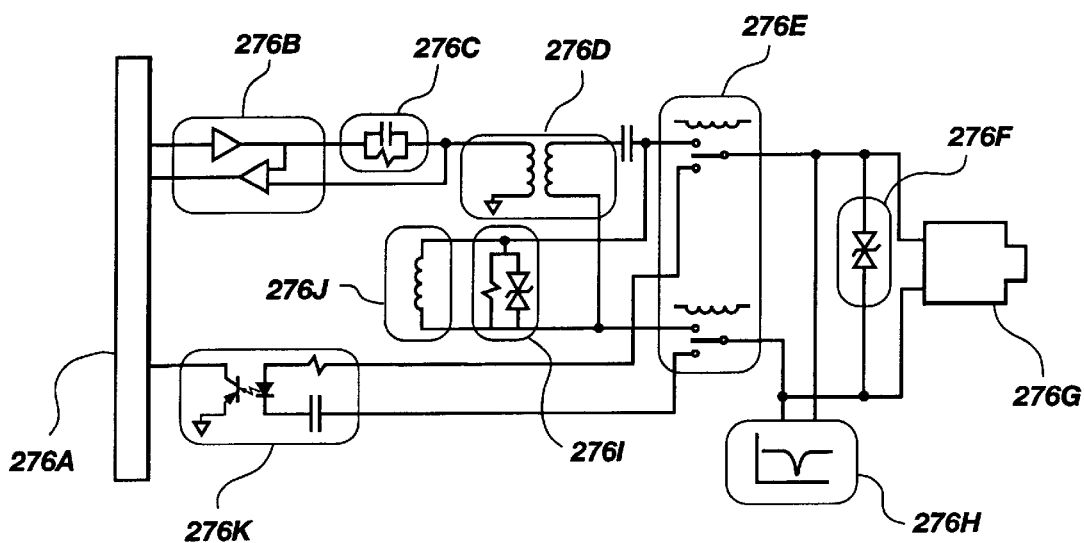

FIGS. 14C–E are high level block diagrams illustrating some of the preferred functions carried out by the replaceable DAA 258. As suggested above, a number of different replaceable DAA 258 units can be provided, each being adapted to carry out a particular function and the user changing the replaceable DAA 258 as necessary. Provided below in Tables A–C are descriptions of the preferred functions carried out by the blocks represented in FIGS. 14C–E, respectively.

TABLE A

FIG. 14C
US DAA

| | |
|---|---|
| 274A | Modem connection |
| 274B | Hybrid circuit |
| 274C | AC impedance network |
| 274D | Signal transducer |
| 274E | Line connector |
| 274F | Transient protection |
| 274G | Loop relay |
| 274H | DC holding current |
| 274I | Ring detect circuit |

TABLE B

FIG. 14D
Norway DAA

| | |
|---|---|
| 275A | Modem connection |
| 275B | Hybrid circuit |
| 275C | AC impedance network |
| 275D | Signal transducer |
| 275E | Loop relays |
| 275F | Transient protection |
| 275G | Line connector |
| 275H | Pulse dial |
| 275I | DC holding current |
| 275J | Ring detect |

TABLE C

FIG. 14E
German DAA

| | |
|---|---|
| 276A | Modem connection |
| 276B | Hybrid circuit |
| 276C | AC impudence network |
| 276D | Signal transducer |
| 276E | Loop relays |
| 276F | Transient protection |
| 276G | Line connector |
| 276H | Billing tone filter |
| 276I | Pulse dial |
| 276J | DC holding current |
| 276K | Ring detect |

FIG. 14F shows a receptacle module 270A which includes only a single RJ-xx series receptacle. Some country's regulations require that only a single telephone line be connected to a telecommunications device. The RJ-xx series receptacle illustrated in FIG. 14F is preferably an eight conductor RJ-45 receptacle. The DAA to which the receptacle module 270A is connected preferably provides the interfacing functions needed to directly attach to the telephone system of the particular country or countries.

Reference will next be made to FIGS. 15A–D which are detailed views of the receptacle module 270 and the structures which allow the receptacle module 270 to extend out of or retract into the replaceable DAA 258 (shown in FIG. 14). It will be appreciated that the structures which allow extension and retraction of the receptacle module 270 can be incorporated into the replaceable DAA 258, directly into a communications card 250, or into any other device which would benefit from the compact communications connector described herein.

Prior to the present invention, if the structures providing RJ-xx series connectors were affixed to the PCMCIA communications card, the connectors would be broken off or damaged and the user would be required to discard the entire communications card and would be stranded with an inoperative communications card. The devices described in U.S. Pat. No. 5,183,404 to Aldous are particularly afflicted by this problem. Prior to the advent of the instant invention, the industry had not recognized the described incidents as a significant problem and the industry has not been able to arrive at the solution described herein.

The present invention allows the structures which provide the communications receptacles to be readily replaced by the user. The user may need to replace the structures which provide the communications receptacles due to damage or in order to interface with different communications lines or devices. The present invention provides these advantages which have not otherwise been available in the industry. Thus, the user can replace damaged receptacle structures, or replace the structure if other functions are necessary, quickly and without any difficulty.

Represented in FIGS. 15A and 15B is a receptacle module 270 which includes two RJ-xx series receptacles, generally represented at 278A&B. FIG. 15A shows the receptacle module 270 in its retracted position. FIG. 15B shows the receptacle module 270 in its extended position. Each of the RJ-xx series receptacles 278A&B is provided with four conductors represented at bracket 284. It will be understood that the representation of the RJ-xx series receptacles described herein is exemplary of one presently preferred application with inclusion of other types of connectors and devices also being within the scope of the present invention.

A frame 280 is shown in FIGS. 15A&B. The frame 280 is, for example, received into a cavity (not represented in FIGS. 15A&B) provided in the replaceable DAA 258 and is held in place by locking ridges 290 which engage notches 273 (FIG. 14). An electrical connector represented at 282 in FIG. 15A–B provides electrical connection and provides further physical stability and can be selected by those skilled in the art using the information provided herein. The frame 280 is removed from the replaceable DAA 258 by the user squeezing together tabs 292 and the frame 280 being pulled from the replaceable DAA 258. It will be appreciated that the structures represented in FIGS. 15A&B can be incorporated into many different devices which are now available in the industry or which may become available in the future.

As represented in FIGS. 15A&B, the receptacle module 270 is biased in its extended position by springs 286. The springs 286 are held in place by posts 286A and 286B. A flexible interconnecting circuit 288 provides electrical connection between the connector 282 and the conductors 284. Further information regarding the interconnecting circuit 288 will be provided in connection with FIGS. 15C&D. As will be appreciated by those skilled in the art, the structures described herein provide the advantage of being more compact than previously possible following conventional teachings in the art.

FIGS. 15C&D show a flexible interconnecting circuit 288 which provides a plurality of conductors indicated at 288A. The flexible interconnecting circuit 288, rather than utilizing pin and socket terminal connections, relies on surface mount connections thus making the structures more compact. The electrical signals received at the connector 282 (FIGS. 15A&B) are conveyed to conductors (not illustrated) formed on the surface of a bar 289 and a holding clip 291 presses the conductors 288A onto the appropriate conductors formed on the surface of the bar 289. The flexible interconnecting circuit 288 bends as necessary to accommodate the extension and retraction of the receptacle module 270.

To make a surface electrical connection with the conductors of the RJ-xx series receptacles, the conductors 288A being held in place by a member 271, the flexible interconnecting circuit 288 is folded so that the conductors 288A are pressed against corresponding conductors represented at 284. The flexible interconnecting circuit 288 is held in place on the member 271 by a clip 277. The receptacle module 270 can provide electrical interconnection between the conductors 284 of the RJ-xx series receptacles 278A&B. Using the described structure, a reliable and compact arrangement is provided to make electrical connection with the RJ-xx series receptacles. As can be seen in the figures. and particularly in FIG. 21, the PCMCIA Type III PC card 340 includes an upper surface 350 and a lower surface 352 which form a portion of the housing for the communication card 340. Also represented in FIG. 21 is a connector 338 which can be used to make a connection to another communication device (in a manner similar to that described in connection with connector 336 illustrated in FIG. 20), as is known in the art.

Referring again to FIGS. 15A&B, a pair of flexible arms 279 are each provided with a protruding knob 281 which is received into a groove formed in the inner surface of the frame which allows the receptacle module 270 to slide within the frame 280 and hold the receptacle module 270 in either its extended or retracted position. Projecting from the side of the receptacle module 270 are wings 282 which provide further positional stability. The leading edge 282A of the wings 282 abuts a stop 283 on the frame to limit the extension motion of the receptacle module 270. The operation of the flexible arms 279 in the retraction and extension movement will be explained in further detail by reference to FIGS. 16A–D.

Figure 16B:
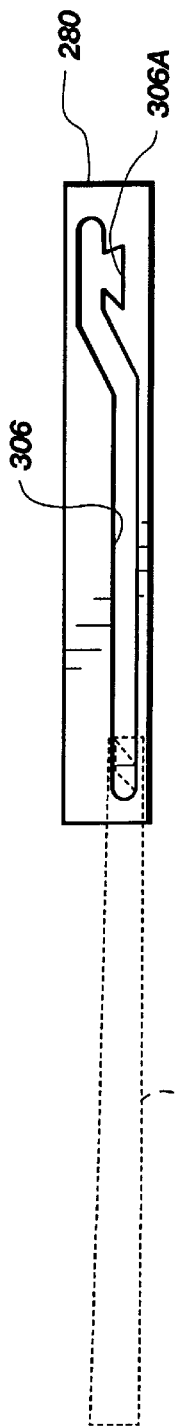
FIGS. 16A, 16B and 16C are side views.
Figure 16A:
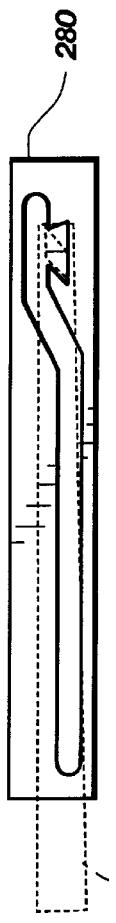

FIG. 16A is a side view of the inner surface of the frame 280 showing a groove 306 formed therein and the receptacle module 270 in its retracted position. As can be seen in FIG. 16A, the knob 281 is held in a trough 306A. The shape of the knob 281 and the shape of the trough 306A, together with the biasing action of the springs (286 in FIGS. 15A&B), keep the knob 281 in the trough 306A. When extension of the receptacle module (270 in FIGS. 15A&B) is desired, the user pushes in on the receptacle module 270 so that the sloping rear side of the knob 281 causes the free end of the flexible arm 279 to bend upward allowing the knob 281 to escape the trough 306A and move forward in the groove 306 to the extended position represented in FIG. 16B.

Figure 16C:
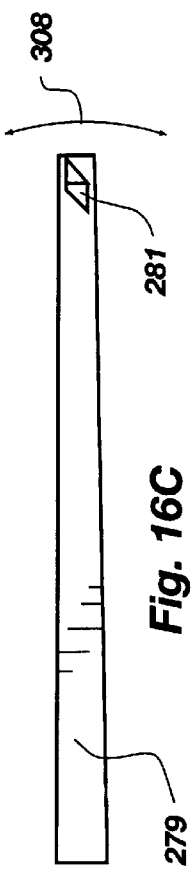
Figure 16D:
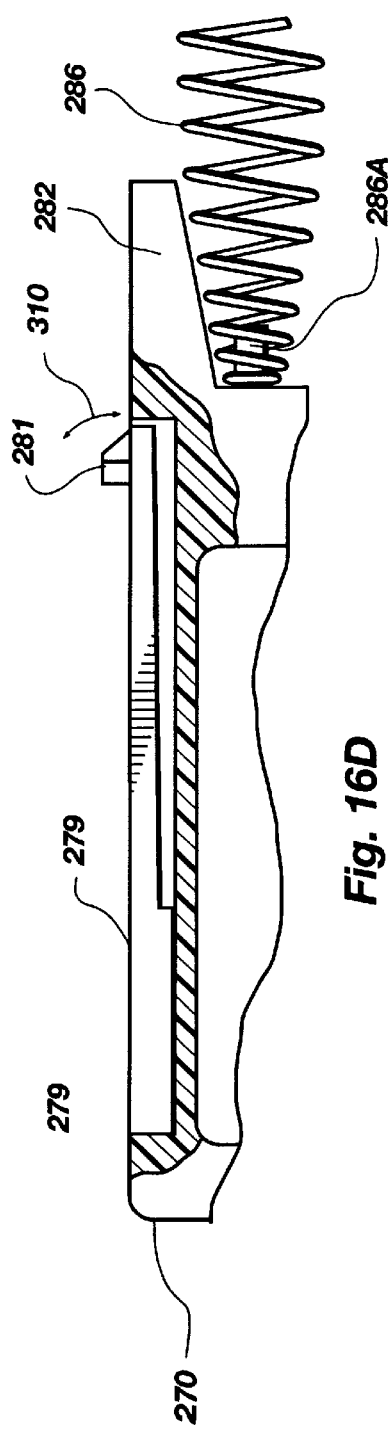
FIG. 16D is a top view, of a mechanism which functions to retract and extend the receptacle module into and out of the replaceable direct access arrangement.

FIG. 16C provides a side view of the flexible arm 279 showing its vertical movement as represented by arrow 308. FIG. 16D provides a top view of a portion of the receptacle module 270 further showing the shape of the knob 281 and the horizontal movement of the flexible arm 279. It will be appreciated that the described structures provide a simple and reliable arrangement for extending and retracting the receptacle module 270 and which advantageously is more compact than previously available structures. By making the retraction and extension structures more compact, more room is provided for other components.

Reference will next be made to FIGS. 17A–C which illustrate in detail additional structures which allow the receptacle module 270 to extend out of or retract into the replaceable DAA 258 (shown in FIG. 14) and the electrical interconnection between the connector 287 and the conductors 284 in the RJ-xx series receptacles. Many of the structures represented in FIGS. 17A&B are the same as the correspondingly numbered structures represented in FIGS. 15A&B. Thus, only the differences between the represented structures will be described.

Represented in FIGS. 17A&B is one of at least two exposed conductors represented at 294A which is attached to the inner surface of frame 280. FIG. 17C shows two sliding electrical contacts 296A and 296B. The sliding electrical contacts 296A&B are preferably of the spring type to ensure that each of the sliding electrical contacts 296A&B makes solid electrical contact to each of the respective conductors, one of which is represented at 294A in the top views of FIGS. 17A&B. An electrical connection is made from the sliding electrical contacts 296A&B, through the receptacle module 270, and to the appropriate conductor 284. It will be understood that many variations on the electrical interconnection structures can be carried out within the scope of the present invention using the information set forth herein.

Figure 18A:
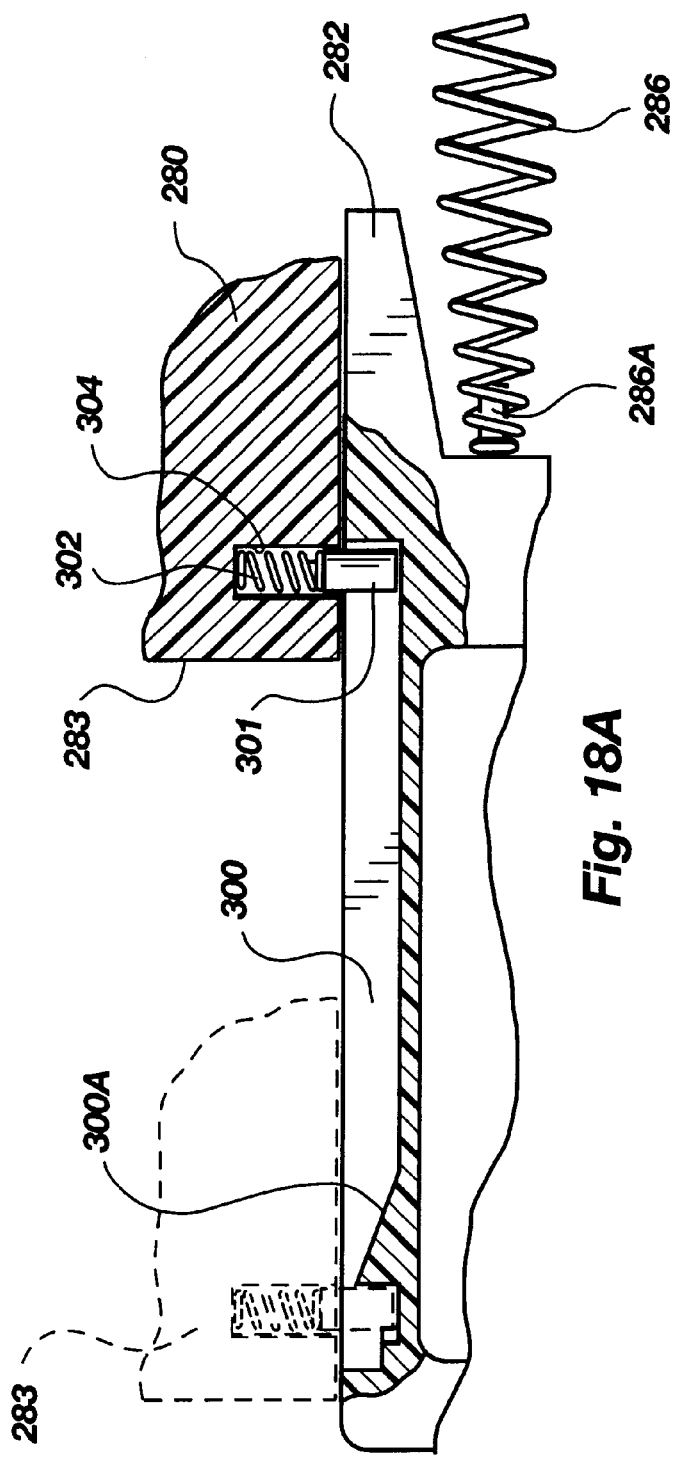
FIGS. 18A and 18B are top and side views, respectively, of a mechanism which functions to retract and extend the receptacle module into and out of the replaceable direct access arrangement.

FIGS. 18A&B will be referred to next to describe the structures which allow the receptacle module 270 to extend and retract. FIG. 18A is a cross sectional top view of the receptacle module 270 showing a groove formed therein. Still referring to FIG. 18A, provided on the inner surface of the stop 283 is a pin 301 which is held in a recess 304 and biased outwardly from the recess 304 by a spring 302. In FIG. 18A, the solid image of the stop 283 and the pin 301 shows their position in the groove 300 when the receptacle module 270 is in its extended position. The biasing force of the spring 286, partially represented in FIGS. 18A&B, holds the receptacle module 270 in its extended position.

Figure 18B:
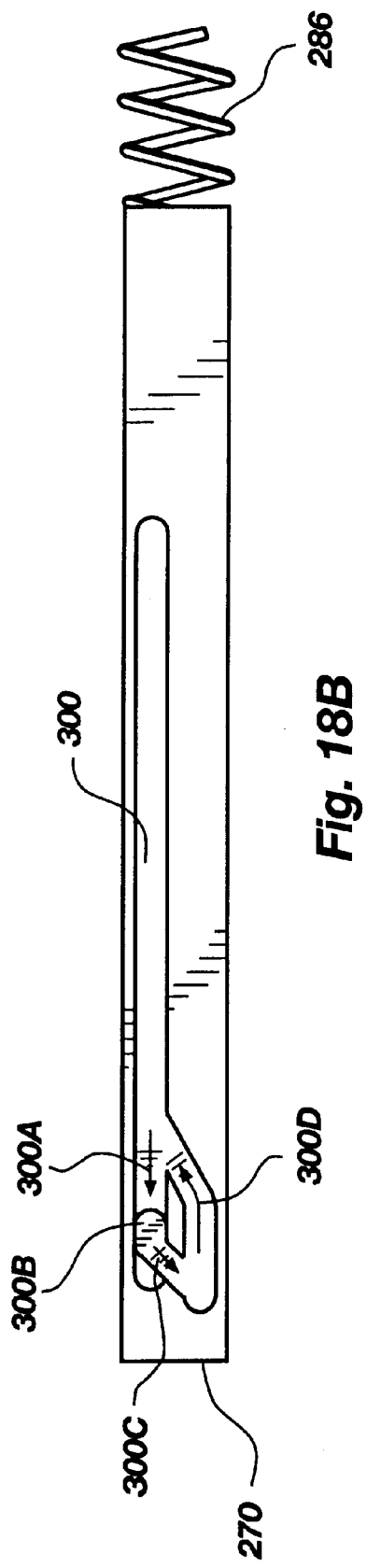

Reference will now be made to both FIGS. 18A and 18B to explain the movement of the receptacle module 270 from its extended position to its retracted position. When the receptacle module 270 is to be moved to its retracted position, the user (not represented in the figures), pushes the receptacle module 270 toward the frame 280. The pin 301 travels in the groove 300 up the ramp 300A and into the well 300B where the pin 301 is held. The retracted position of the receptacle module 270 is represented by the phantom image in FIG. 18A. To move the receptacle module 270 from its retracted position to its extended position, the user again pushes the receptacle module 270 inward toward the frame 280 which causes the pin 301 to move out of the well 300B up a ramp indicated by arrow 300C. The user then releases the receptacle module 270 which allows the receptacle module 270 to extend and the pin 301 to travel down a ramp indicated by arrow 300D where the pin 301 again enters groove 300 and the receptacle module 270 completes its extension.

Reference will next be made to FIGS. 19A–C. In order to accommodate wireless communication between the communications card and a wireless communication system, an antenna is provided on the communications cards represented in FIGS. 19A–C. The embodiments of the present invention illustrated in FIGS. 19A–C are particularly adapted for accommodating cellular telephone signals but those skilled in the art can readily adapt the embodiments to accommodate other communication systems, including those utilizing radio frequency techniques as well as other mediums.

FIG. 19A illustrates an antenna 312 which pivots into and out of the end of the communications card 250 in the directions of arrow 312A. When use of the antenna is desired, the user depresses a release button 315 which allows the antenna to pivot out of the end of the communications card.

FIG. 19B illustrates an antenna 318 which is pivotally mounted on a retractable block 314. When use of the antenna is desired, the user depresses a release button 315 which allows the antenna 318 to pivot in the directions of arrow 318A. The retractable block 314 can be stored within the communications card and extended and retracted in the directions of arrow 314A and released from its retracted position by depressing button 316.

FIG. 19C illustrates an antenna 322 which is pivotally mounted on a retractable block 320. The retractable block 320 is extended by depression of button 316. When the retractable block 320 is extended, the antenna 322 is pivoted up or down in the direction of arrow 322A. Also provided on the retractable block 320 is a receptacle 324 allowing a communications line to also be attached thereto.

Each of the arrangements represented in FIGS. 19A–C can be best adapted for use with particular types of antenna which may assume shapes and sizes very different than the illustrated antennas. For example, antennas which are vertically polarized, horizontally polarized, or circularly polarized can have application with the embodiments of the present invention. Moreover, the antennas used with the embodiments illustrated in FIGS. 19A–C can include components which extend or further pivot to increase the length of, or change the shape of, the antenna. Those skilled in the art will appreciate that the components necessary to carry out wireless communication, such as cellular telephone communication, can be packaged in the communications card 250 or in a DAA adapted for such purpose. Further information regarding wireless computer networks can be obtained from IEEE 802.11 Standard (and any available drafts thereof) which is now incorporated herein by reference in its entirety.

Figure 20:
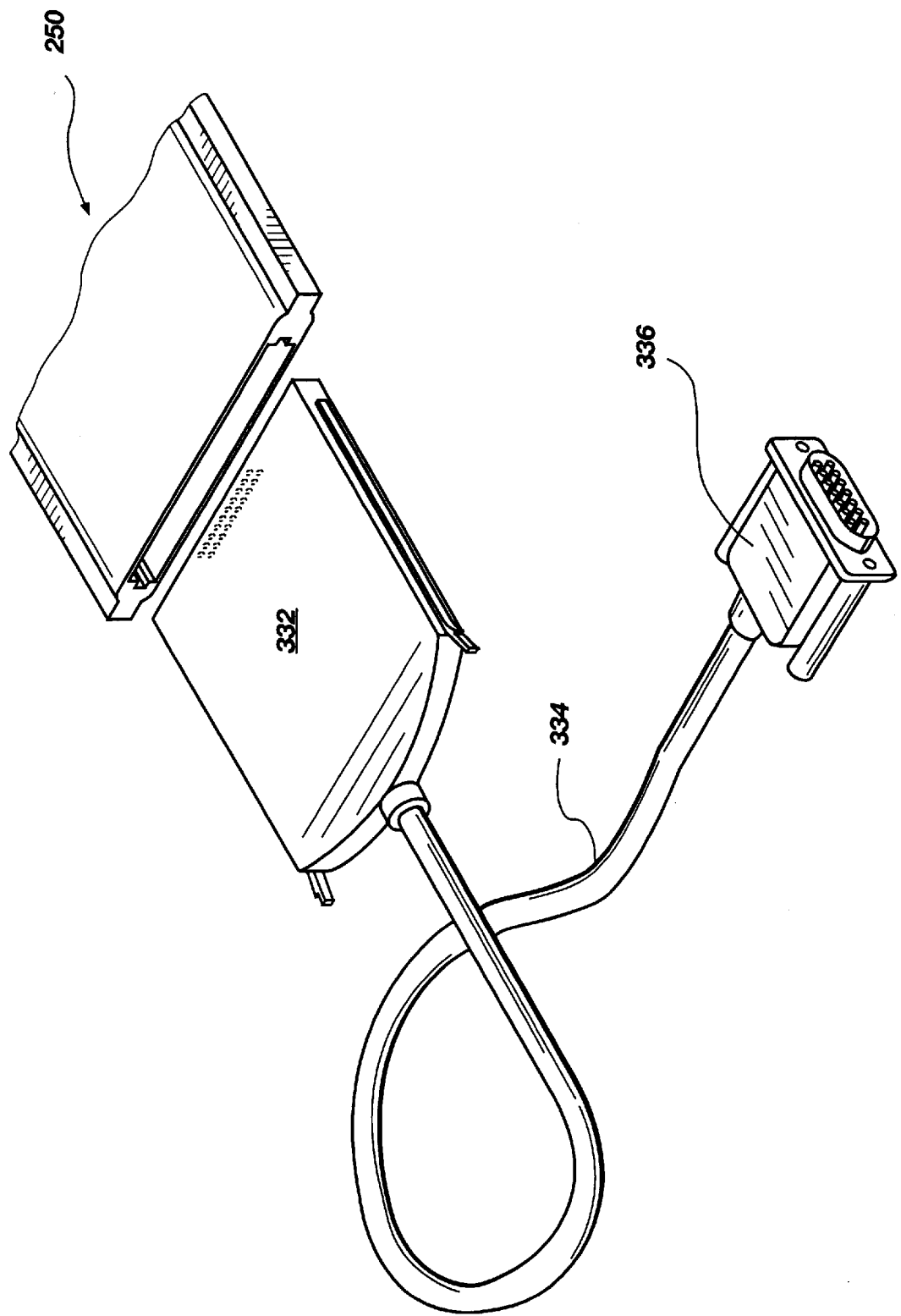
FIG. 20 is a perspective view of an embodiment of the present invention which is adapted for use with a portable cellular telephone.
Figure 21:
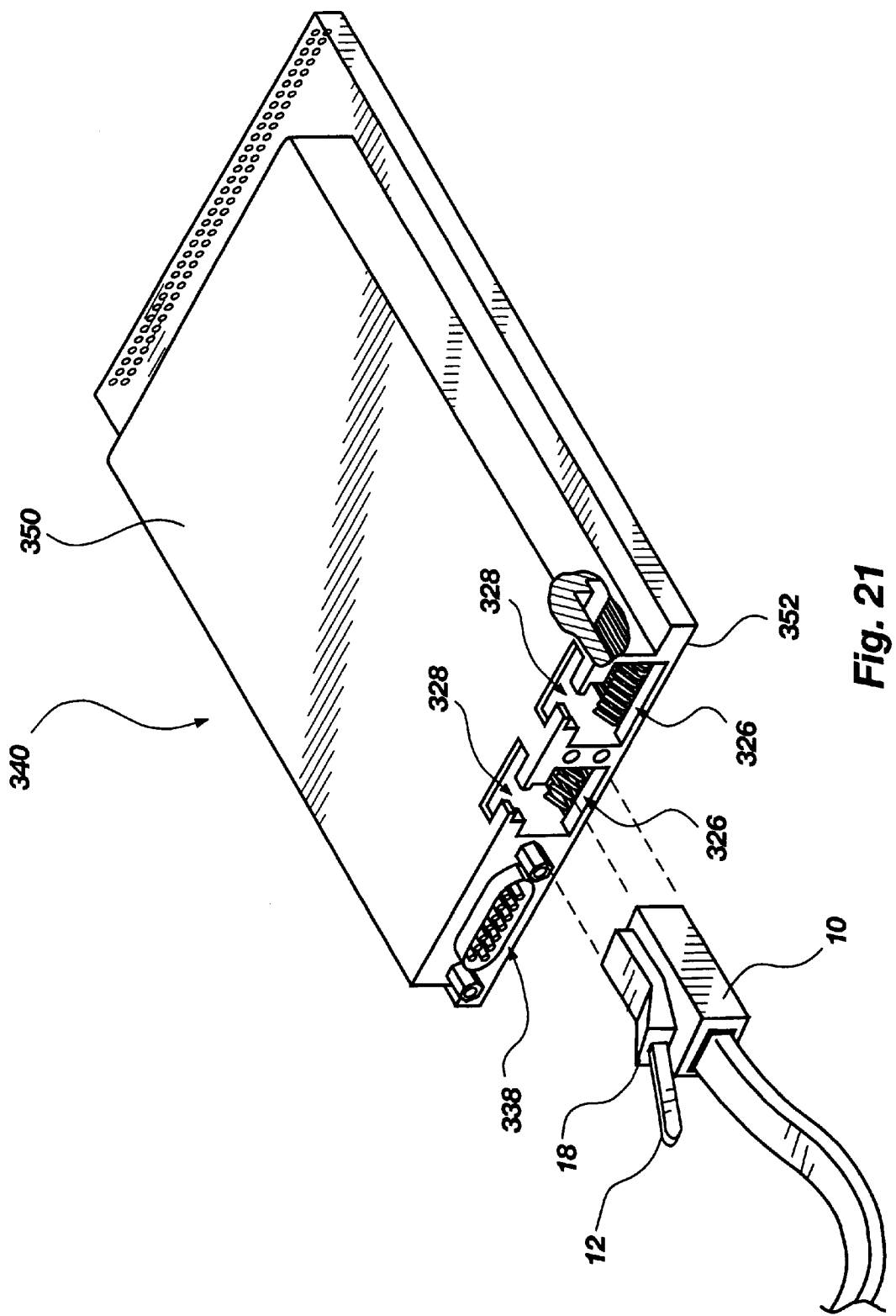
FIG. 21 is a perspective view of a communications card in accordance with the present invention having an RJ-xx series receptacle placed directly in the end thereof.

Reference will next be made to FIG. 20 which shows a communication card 250 and a replaceable DAA 332 which are adapted to interface with a portable cellular telephone via a cable 334 and a connector 336 which attaches directly to a corresponding connector (not illustrated) on the portable cellular telephone (not illustrated). It will be appreciated that those skilled in the art will be able to provide replaceable DAAs 332 and connectors 336 which are adapted to function with any number of cellular telephones or other communications devices and which allow the user to easily and quickly change the application to which the communications card is put.

Reference will next be made to FIG. 21. FIG. 21 provides a perspective view of a communications card generally designated 340. The communications card 340 follows the PCMCIA (also referred to as PC Card) Type III standard for dimensions and configuration. The height of a PCMCIA Type III card is still not great enough to allow a standard RJ-xx series receptacles to be mounted therein. In the communications card 340 illustrated in FIG. 21, a T-shaped cutout 328 is removed from the housing of the communications card 340. The T-shaped cutout 328 accommodates the biased clip 12 and the ridge 18 present on the plug 10. The shape of the T-shaped cutout 328 engages the biased clip 12 and the ridge 18 to hold the plug 10 in place. Represented in FIG. 21 are two receptacles, each generally designated at 326. Preferably, one of the receptacles 326 is an eight conductor RJ-45 receptacle, which is called for in some computer network standards, and the other of the receptacles 326 is an RJ-11 receptacle.

In view of the foregoing, it will be appreciated that the present invention provides a communications line receptacle for use with a miniaturized communications device wherein the electrical contacts are shielded from the surrounding environment and which is resistant to breakage and which can be moved out of the way when not being used. The present invention also provides a communications line receptacle which is easily replaceable if broken. The present invention also provides a communications card which can be readily adapted to meet various communications standards and which can provide wireless communications.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. An apparatus for holding an RJ series plug having a biased clip, first and second electrical contacts located on a first face having a width and a length, the RJ series plug being associated with a communications device, the apparatus further for making electrical connection with at least first and second electrical contacts provided on the plug, the apparatus comprising:

a body;

a recess in the body, the recess having dimensions such that the plug is closely received therein;

a member pivotally attached to the body such that the member pivots from a first position substantially over the recess to a second position at an angle over the recess;

means for restricting the movement of the member such that the member can be moved to the second position with the first face of the plug placed in the recess facing away from the member and the member engages the biased clip such that it holds the first face of the plug in the recess and such that the movement of the member at the second position is limited to substantially no more than forty-five degrees from the first position;

a first electrical conductor provided in the recess, the first electrical conductor being positioned such that it makes electrical continuity with the first electrical contact in the plug when the plug is received by the recess and when the member releasably engages the biased clip;

a second electrical conductor provided in the recess, the second electrical conductor being positioned such that it makes electrical continuity with the second electrical contact in the plug when the plug is received by the recess and when the member releasably engages the biased clip; and means for conveying any electrical signal present on the first and second electrical contacts to the communications device.

2. An apparatus as defined in claim 1 wherein the body comprises a plastic member.

3. An apparatus as defined in claim 1 wherein the recess is a rectangular shape.

4. An apparatus as defined in claim 1 wherein the means for conveying comprises electrical conductors.

5. An apparatus as defined in claim 1 wherein the means for conveying comprises wires and an electrical connecter.

6. An apparatus as defined in claim 1 wherein the recess in the body comprises a notch formed in the body.

7. An apparatus as defined in claim 1 wherein the dimensions of the recess are such that an RJ-11 plug is closely received therein.

8. An apparatus as defined in claim 1 wherein the means for restricting the movement of the member comprises a spring.

9. An apparatus as defined in claim 1 wherein the member comprises a ledge which engages the biased clip.

10. An apparatus for holding an RJ series plug having a biased clip, first and second electrical contacts located on a first face having a width and a length, the RJ series plug being associated with a communications device, the apparatus further for making electrical connection with at least first and second electrical contacts provided on the plug, the apparatus comprising:

a body;

a recess in the body, the recess having a first opening, an adjacent second opening, a first wall and a second wall such that the plug is closely received therein;

a member pivotally attached to the body such that the member pivots from a first position substantially over the recess to a second position substantially no more than forty-five degrees from the first position;

means for restricting the pivoting movement of the member away from the recess such that the member can be moved to the second position and the first face of the plug placed in the recess facing away from the member and the member engages the biased clip and is biased to hold the first face of the plug in the recess;

a first electrical conductor provided in the recess, the first electrical conductor being positioned such that it makes electrical continuity with the first electrical contact in the plug when the plug is received by the recess and when the member engages the biased clip;

a second electrical conductor provided in the recess, the second electrical conductor being positioned such that it makes electrical continuity with the first electrical contact in the plug when the plug is received by the recess and when the member engages the biased clip; and means for conveying any electrical signal present on the first and second electrical contacts to the communications device.

* * * * *